US011329162B2

(12) United States Patent
Kobrinsky et al.

(10) Patent No.: US 11,329,162 B2
(45) Date of Patent: May 10, 2022

(54) INTEGRATED CIRCUIT STRUCTURES HAVING DIFFERENTIATED NEIGHBORING PARTITIONED SOURCE OR DRAIN CONTACT STRUCTURES

(71) Applicant: Intel Corporation, Santa Clara, CA (US)

(72) Inventors: Mauro J. Kobrinsky, Portland, OR (US); Stephanie Bojarski, Beaverton, OR (US); Myra McDonnell, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 732 days.

(21) Appl. No.: 16/122,277

(22) Filed: Sep. 5, 2018

(65) Prior Publication Data

US 2020/0075770 A1   Mar. 5, 2020

(51) Int. Cl.
  *H01L 29/786*   (2006.01)
  *H01L 27/092*   (2006.01)
  (Continued)

(52) U.S. Cl.
  CPC .. *H01L 29/78618* (2013.01); *H01L 21/02532* (2013.01); *H01L 21/02603* (2013.01);
  (Continued)

(58) Field of Classification Search
  CPC ......... H01L 21/02532; H01L 21/02603; H01L 21/823807; H01L 21/823814;
  (Continued)

(56) References Cited

U.S. PATENT DOCUMENTS 9,837,414 B1 * 12/2017 Balakrishnan ............................... H01L 21/823871
2015/0380305 A1 * 12/2015 Basker .............. H01L 21/76844
257/77

(Continued)

FOREIGN PATENT DOCUMENTS

WO   WO 2017/111866   6/2017
WO   WO 2018/063302   4/2018

OTHER PUBLICATIONS

Search Report for European Patent Application No. 19183496.9, dated Mar. 24, 2020, 12 pgs.

(Continued)

*Primary Examiner* — Tong-Ho Kim
(74) *Attorney, Agent, or Firm* — Schwabe, Williamson & Wyatt, P.C.

(57) ABSTRACT

Integrated circuit structures having differentiated neighboring partitioned source or drain contact structures are described. An integrated circuit structure includes a first gate stack over a first fin, and a second gate stack over a second fin. First and second epitaxial source or drain structures are at first and second ends of the first fin. Third and fourth epitaxial source or drain structures are at first and second ends of the second fin. A first conductive contact structure is coupled to one of the first or the second epitaxial source or drain structures, and has a first portion partitioned from a second portion. A second conductive contact structure is coupled to one of the third or the fourth epitaxial source or drain structures, and has a first portion partitioned from a second portion. The second conductive contact structure is neighboring the first conductive contact structure and has a composition different than a composition of the first conductive contact structure.

25 Claims, 16 Drawing Sheets

(51) Int. Cl.
  *H01L 29/06* (2006.01)
  *H01L 29/417* (2006.01)
  *H01L 29/423* (2006.01)
  *H01L 21/02* (2006.01)
  *H01L 21/8238* (2006.01)

(52) U.S. Cl.
  CPC ......... *H01L 21/823807* (2013.01); *H01L 21/823814* (2013.01); *H01L 27/092* (2013.01); *H01L 29/0673* (2013.01); *H01L 29/41733* (2013.01); *H01L 29/42392* (2013.01); *H01L 29/78651* (2013.01); *H01L 29/78696* (2013.01)

(58) Field of Classification Search
  CPC ......... H01L 27/092; H01L 29/78618; H01L 29/0673; H01L 29/41733; H01L 29/42392; H01L 29/78651; H01L 29/78696
  USPC ......................................................... 257/351
  See application file for complete search history.

(56) References Cited

U.S. PATENT DOCUMENTS

2017/0053918 A1* 2/2017 Cheng ............... H01L 23/5329
2019/0221649 A1* 7/2019 Glass ............. H01L 21/823871

OTHER PUBLICATIONS

Office Action for European Patent Application No. 19183496.9, dated Sep. 21, 2021, 8 pgs.

* cited by examiner

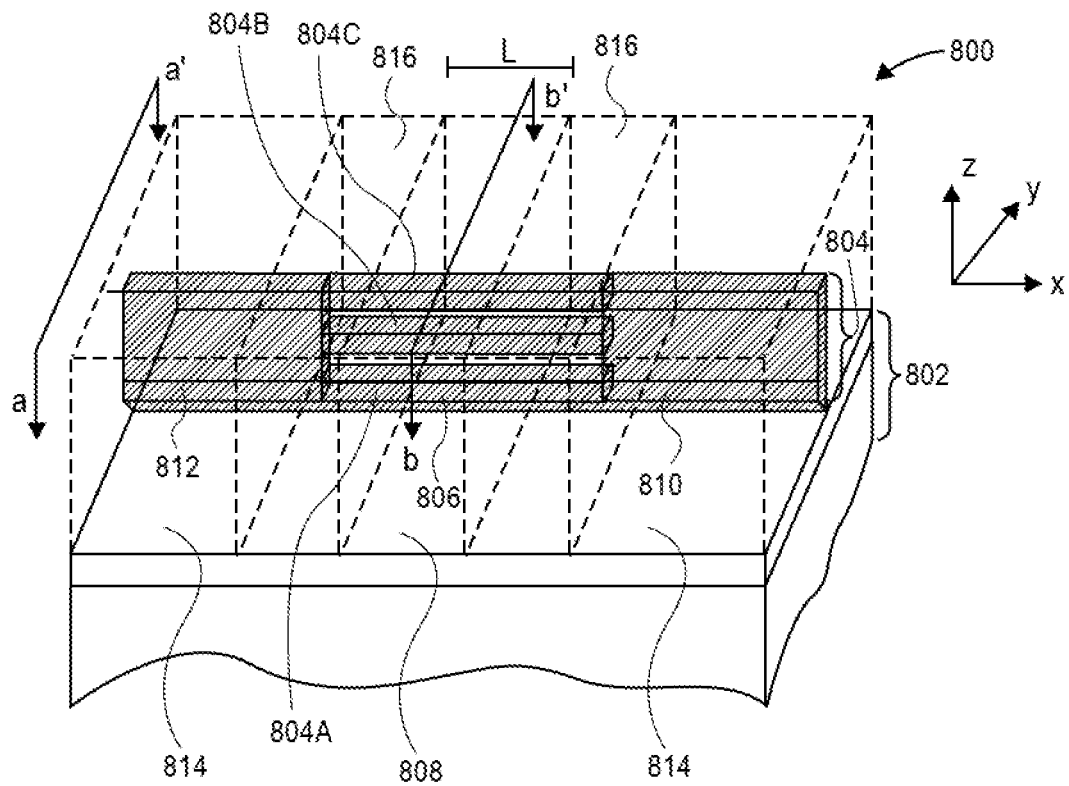
FIG. 8A
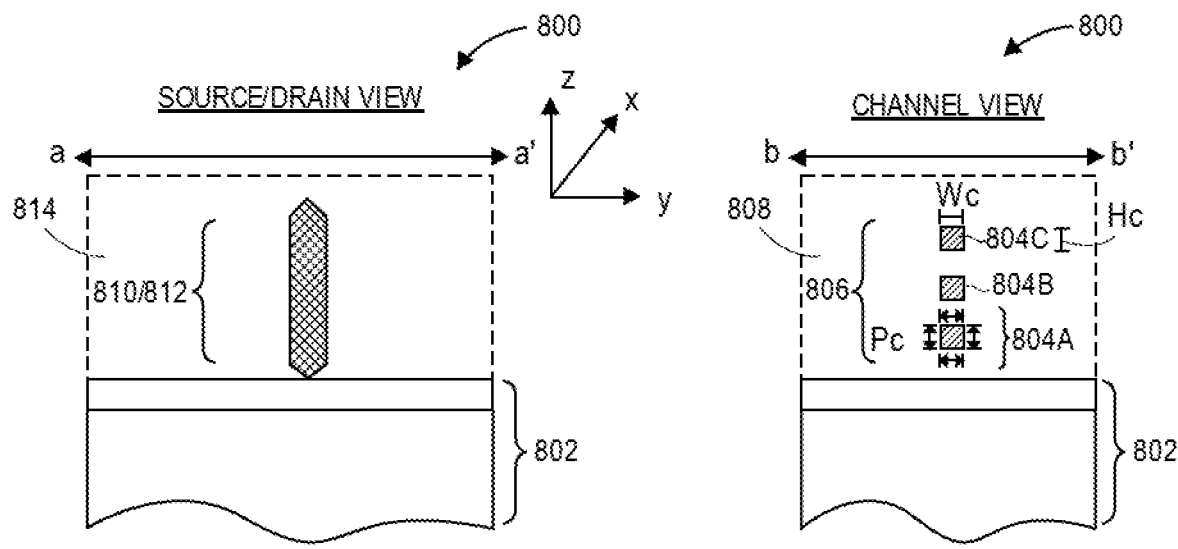
FIG. 8B  FIG. 8C

INTEGRATED CIRCUIT STRUCTURES HAVING DIFFERENTIATED NEIGHBORING PARTITIONED SOURCE OR DRAIN CONTACT STRUCTURES

TECHNICAL FIELD

Embodiments of the disclosure are in the field of integrated circuit structures and processing and, in particular, integrated circuit structures having differentiated neighboring partitioned source or drain contact structures, and methods of fabricating integrated circuit structures having differentiated neighboring partitioned source or drain contact structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

Device density in integrated circuits (ICs) has increased for decades in conformance with Moore's law. However, as the lateral dimensions of a device structure shrink with each technology generation, it becomes increasingly difficult to further reduce structural dimensions. Three-dimensional (3D) scaling is now of considerable interest as reductions in z-height (device thickness) offer another avenue of increasing overall device density and IC performance. 3D scaling may be in the form of chip stacking or packaged IC stacking, for example. Known 3D integration techniques are expensive and may offer only incremental improvements in z-height and device density. For example, the majority of the thickness of a chip may be inactive substrate material. A stack of such chips may employ through-substrate via (TSV) technology as a means of vertically interconnecting the chip stack. A TSV typically extends through 20-50 µm, or more, of substrate material and therefore is generally limited to via diameters on the micron-scale. As such, TSV density is limited to far below the density of most device (e.g., transistor, memory) cells. Also, the final z-height of a chip-stack employing TSV technology may be hundreds of microns thicker than the actual device layers employed by the stacked device.

3D scaling may also be in the form of vertically-oriented devices, for example where a transistor channel length is substantially normal to a surface of a substrate rather than parallel to that surface for the more common laterally-oriented transistor. One problem faced by many vertically-oriented device architectures is how to fabricate terminals on opposite ends of the device, which is more readily done for laterally-oriented devices.

BRIEF DESCRIPTION OF THE DRAWINGS

FIG. 8A illustrates a three-dimensional cross-sectional view of a nanowire-based integrated circuit structure, in accordance with an embodiment of the present disclosure.

FIG. 8B illustrates a cross-sectional source or drain view of the nanowire-based integrated circuit structure of FIG. 8A, as taken along the a-a' axis, in accordance with an embodiment of the present disclosure.

FIG. 8C illustrates a cross-sectional channel view of the nanowire-based integrated circuit structure of FIG. 8A, as taken along the b-b' axis, in accordance with an embodiment of the present disclosure.

DESCRIPTION OF THE EMBODIMENTS

Figure 1C:
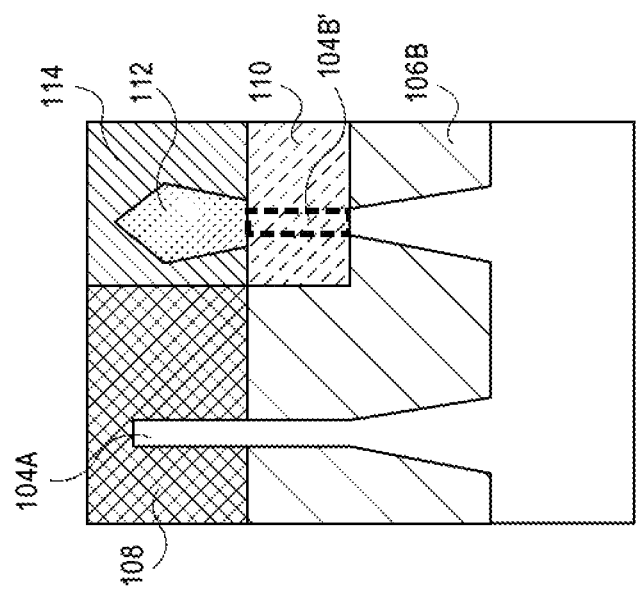
FIGS. 1A-1J illustrate cross-sectional views of various operations in a method of fabricating an integrated circuit structure having differentiated neighboring source or drain contact structures, in accordance with an embodiment of the present disclosure.

Integrated circuit structures having differentiated neighboring partitioned source or drain contact structures, and methods of fabricating integrated circuit structures having differentiated neighboring partitioned source or drain contact structures, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to dual epitaxial (EPI) connection, such as epitaxial source or drain region connection, in a fin configuration. One or more embodiments described herein are directed to dual epitaxial (EPI) connection, such as epitaxial source or drain region connection, in a nanowire or nanoribbon configuration. One or more embodiments described herein are directed fully self-aligned dual EPI contacts.

To provide context, increasing a number of devices with decreased dimensions requires interconnects with decreasing dimensions. However, interconnects with decreasing dimensions are typically associated with negatively affecting interconnect/product performance, and can result in longer development cycles and increased manufacturing costs. Prior solutions have involved scaling interconnect dimensions (e.g., width and height), and adding interconnect layers in some cases. Other prior solutions have included the use of added back-side contacts, but contact area may limited by the presence of fins, resulting in high contact resistance. Also, tight alignment requirements for back-side contacts, as affected by 3D processing, can cause distortions resulting in poor feature (e.g., via) edge-placement error capability.

In accordance with an embodiment of the present disclosure, self-aligned connections to the back-side of devices are implemented to provide relaxed edge-placement error requirements post bonding processing. Such relaxed edge-placement error requirements post bonding can results in simpler and lower cost manufacturing. Embodiments may include the implementation of connections to source or drain regions of devices from a bottom and a top of the devices, providing for additional connections. Implementation of embodiments described herein may simplify power delivery and save interconnect tracks. As a consequence, the fabrication of interconnects with relatively looser pitch and larger width may be enabled, providing for improved signal and power delivery performance, as well as lower interconnect cost.

In an exemplary processing scheme involving a semiconductor fin, FIGS. 1A-1J illustrate cross-sectional views of various operations in a method of fabricating an integrated circuit structure having differentiated neighboring source or drain contact structures, in accordance with an embodiment of the present disclosure. It is to be appreciated that the cross-sectional perspective shown represents fin cuts centered on diffusion locations, such as source or drain locations.

Figure 1B:
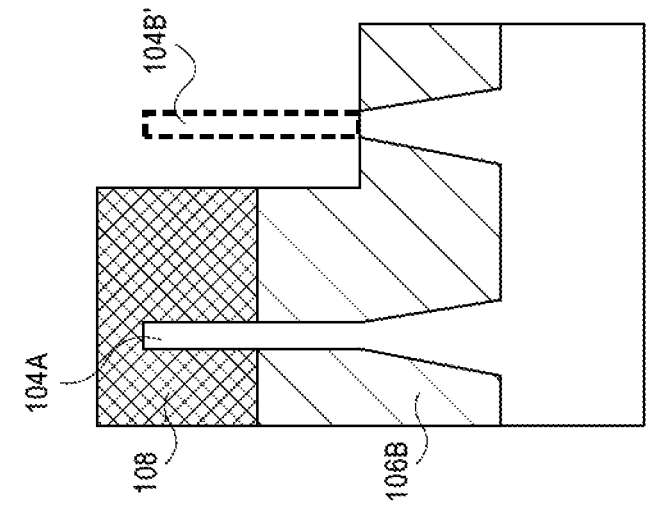
Figure 1A:
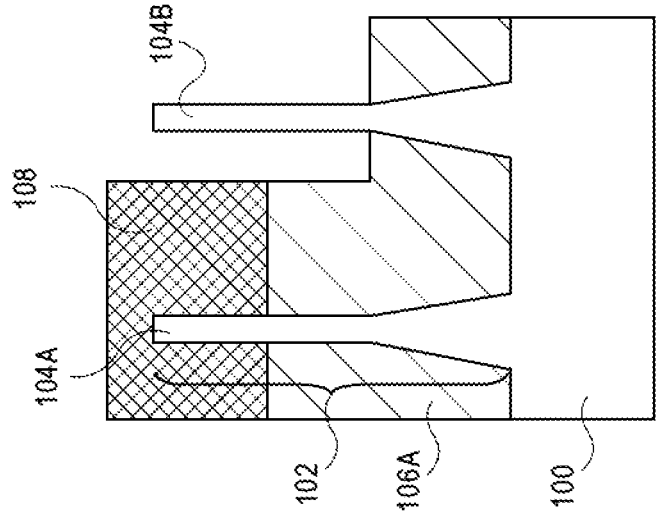

Referring to FIG. 1A, a starting structure includes a substrate 100 having first and second fins 102 protruding therefrom. A first upper fin portion 104A of a first fin 102 and a second upper fin portion 104B of a second fin 102 are above a shallow trench isolation (STI) region 106A. The first upper fin portion 104A is covered with a mask 108. It is to be appreciated that one or more gate stacks or dummy gate stacks (for a later replacement gate scheme) are over the first upper fin portion 104A and the second upper fin portion 104B but are not depicted in the perspective of FIG. 1A since such one or more gate stacks would in a location in a direction into the page.

Referring to FIG. 1B, the STI region 106A is recessed in a location of the second upper fin portion 104B to form recessed STI region 106B. Exposed portions of the second upper fin portion 104B and exposed portions of the second fin 102 underlying the second upper fin portion 104B are then removed to leave removed region 104B' (shown as a dashed box for illustrative purposes). It is to be appreciated that the dashed box in 1B may represent either (1) recess only the STI leaving the fin intact, or (2) recess both the STI and fin.

Referring to FIG. 1C, a sacrificial material 110, such as a sacrificial insulating material or dielectric material, is formed by a fill and recess process over the structure of FIG. 1B. In an embodiment, a sacrificial dielectric liner with metallic fill is used to provide selectivity between the fill material and an adjacent STI, where a dielectric liner can provide isolation from a metallic fill and the subfin. In another embodiment, a conductive material is formed in the location of sacrificial material 110. In either case, epitaxial semiconductor growth is then performed to provide epitaxial source or drain structures 112 at ends of the second fin (one such structure shown in the perspective of FIG. 1C).

Referring again to FIG. 1C, top conductive contacts 114 are then formed on the top surface of epitaxial source or drain structures 112. In one embodiment, an intervening dielectric layer (not shown) is formed prior to forming the top conductive contacts 114, enabling isolation with a subsequently formed bottom contact structure. In another embodiment, as depicted, an intervening dielectric layer is not formed prior to forming the top conductive contacts 114, enabling electrical shorting with a subsequently formed bottom contact structure. The latter case is carried along in the description of FIGS. 1D-1J.

Figure 1F:
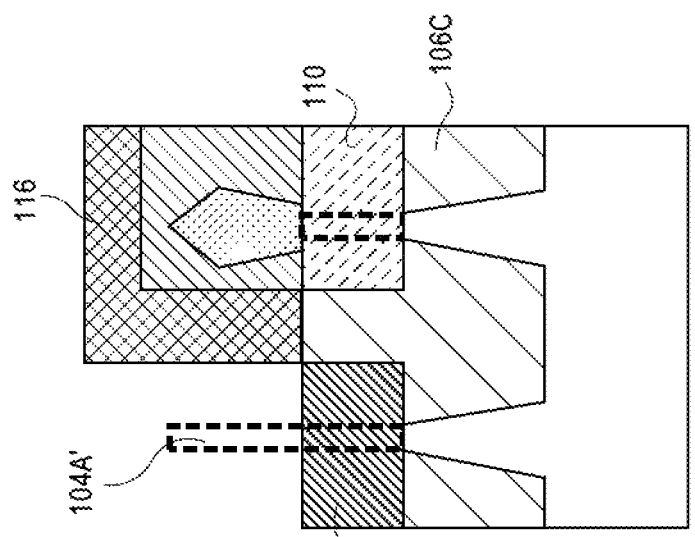
Figure 1E:
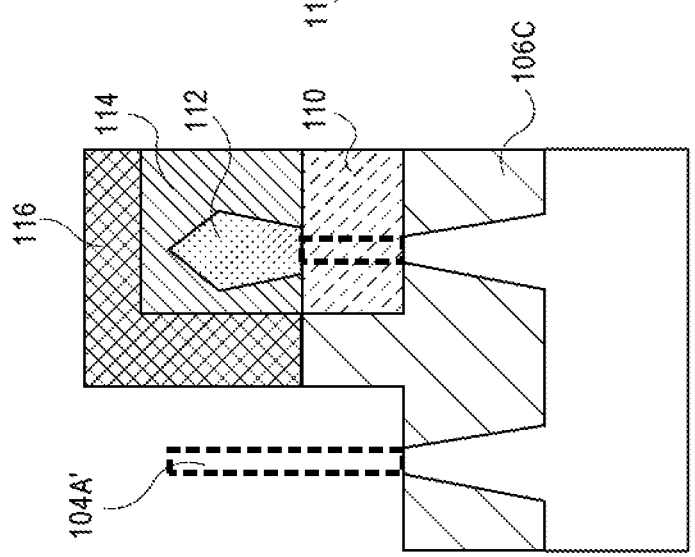
Figure 1D:
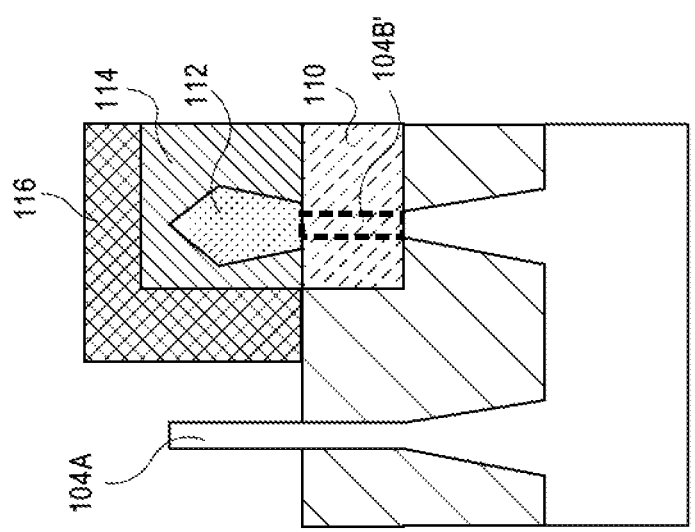

Referring to FIG. 1D, mask 108 is removed from the structure of FIG. 1C. A mask 116 is formed on the top conductive contacts 114 of the second (right) fin. The processing leaves first upper fin portion 104A exposed.

Referring to FIG. 1E, the STI region 106B is recessed in a location of the first upper fin portion 104A to form recessed STI region 106C. Exposed portions of the first upper fin portion 104A and exposed portions of the first fin 102 underlying the first upper fin portion 104A are then removed to leave removed region 104A' (shown as a dashed box for illustrative purposes). It is to be appreciated that the dashed box in 1E may represent either (1) recess only the STI leaving the fin intact, or (2) recess both the STI and fin.

Referring to FIG. 1F, a sacrificial material 118, such as a sacrificial insulating material or dielectric material, is formed by a fill and recess process over the structure of FIG. 1E. In another embodiment, a conductive material is formed in the location of sacrificial material 118. In either case, whether a sacrificial dielectric is formed or a conductive material is formed, the material at location 118 has an etch characteristic different than the material at location 110, such that later etch selectivity may later be achieved between the two materials.

Figure 1H:
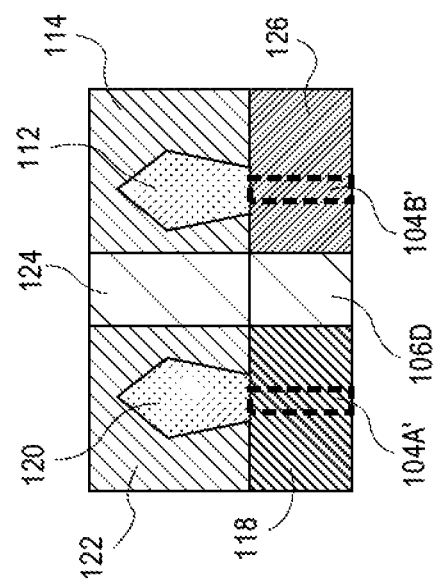
Figure 1G:
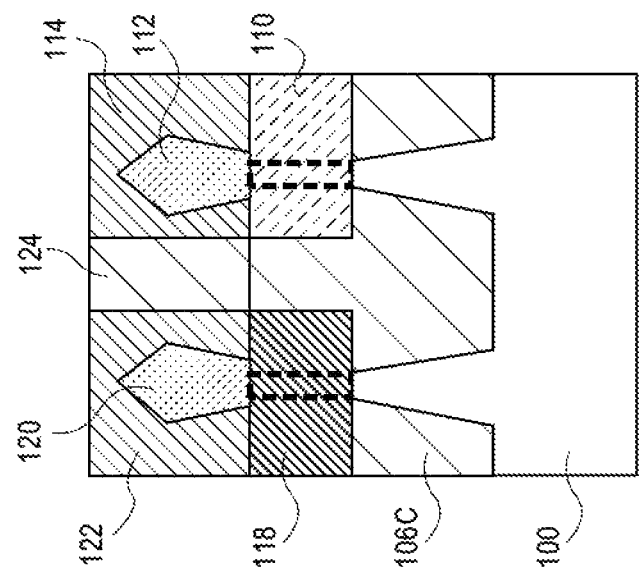

Referring to FIG. 1G, epitaxial semiconductor growth is then performed to provide epitaxial source or drain structures 120 at ends of the second fin (one such structure shown in the perspective of FIG. 1G). Top conductive contacts 122 are then formed on the top surface of epitaxial source or drain structures 120. In one embodiment, an intervening dielectric layer (not shown) is formed prior to forming the top conductive contacts 122, enabling isolation with a subsequently formed bottom contact structure. In another embodiment, as depicted, an intervening dielectric layer is not formed prior to forming the top conductive contacts 122, enabling electrical shorting with a subsequently formed bottom contact structure. The latter case is carried along in the description of FIGS. 1H-1J. Referring again to FIG. 1G, a dielectric structure 124 may be formed between the top conductive contacts structures 114 and 122. Such a dielectric structure 124, if formed further into the page at locations between gate ends, can be used as a type gate endcap structure, several examples of which are described in greater detail below.

Referring to FIG. 1H, wafer bonding and grinding is performed to expose the sacrificial materials 110 and 118 and to reduce recessed STI region 106C to STI region 106D. Sacrificial material 110 is then removed and replaced with a bottom conductive contact structure 126. The bottom conductive contact structure 126 may be described as being self-aligned to the epitaxial source or drain structures 112 at a bottom surface of the epitaxial source or drain structures 112.

Figures 1I, 1J:
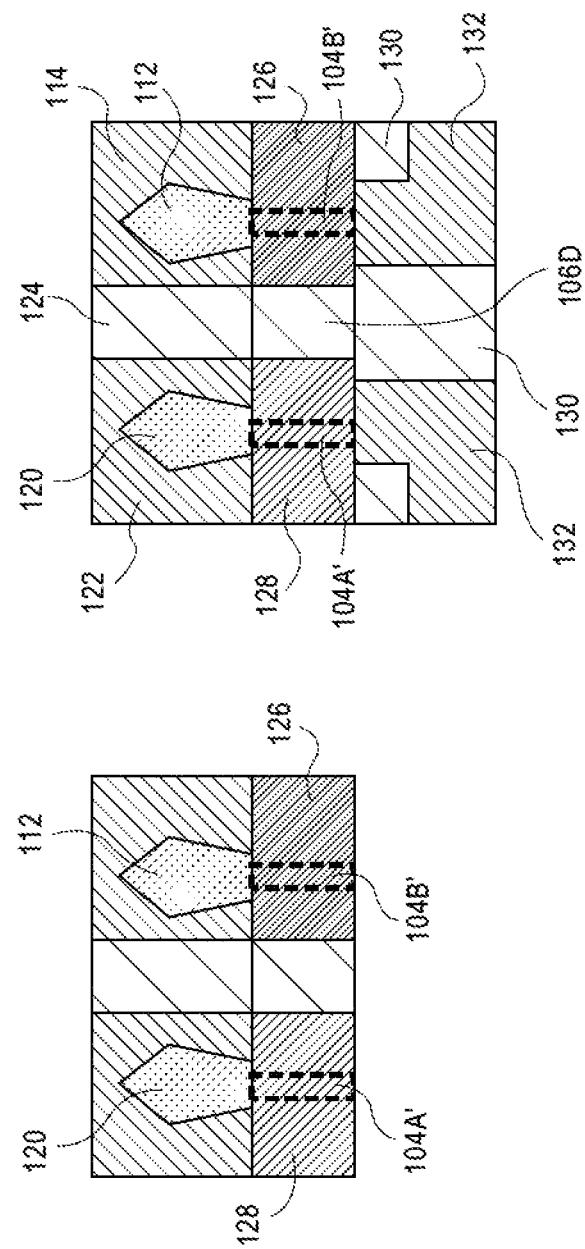

Referring to FIG. 1I, sacrificial material 118 is then removed and replaced with a bottom conductive contact structure 128. The bottom conductive contact structure 128 may be described as being self-aligned to the epitaxial source or drain structures 120 at a bottom surface of the epitaxial source or drain structures 120. It may be appreciated that, alternatively, sacrificial material 118 is replaced with bottom conductive contact structure 128 prior to replacing sacrificial material 110 with bottom conductive contact structure 126.

In accordance with an embodiment of the present disclosure, the material of bottom conductive contact structure 128 is different than the material of bottom conductive contact structure 126, and may be referred to as neighboring differentiated bottom conductive contact structure, or neighboring differentiated partitioned conductive contact structures when including reference to upper conductive contact portions 114 and 122. Such differentiation between bottom conductive contact structure 128 and bottom conductive contact structure 126 may allow for selective exposure or selective processing of later formed back side interconnects. In an alternative embodiment, the material of bottom conductive contact structure 128 is the same as the material of bottom conductive contact structure 126, and they may be referred to as neighboring but not differentiated bottom conductive contact structures.

Referring to FIG. 1J, backside interconnect 132 may be formed on the structure of FIG. 1I. The backside interconnects 132 may include a patterned interlayer dielectric (ILD) layer 130 having conductive material formed thereon and in openings thereof. In one embodiment, the backside interconnects 132 make electrical contact to corresponding ones of the bottom conductive contact structures 126 and 128.

Figure 2:
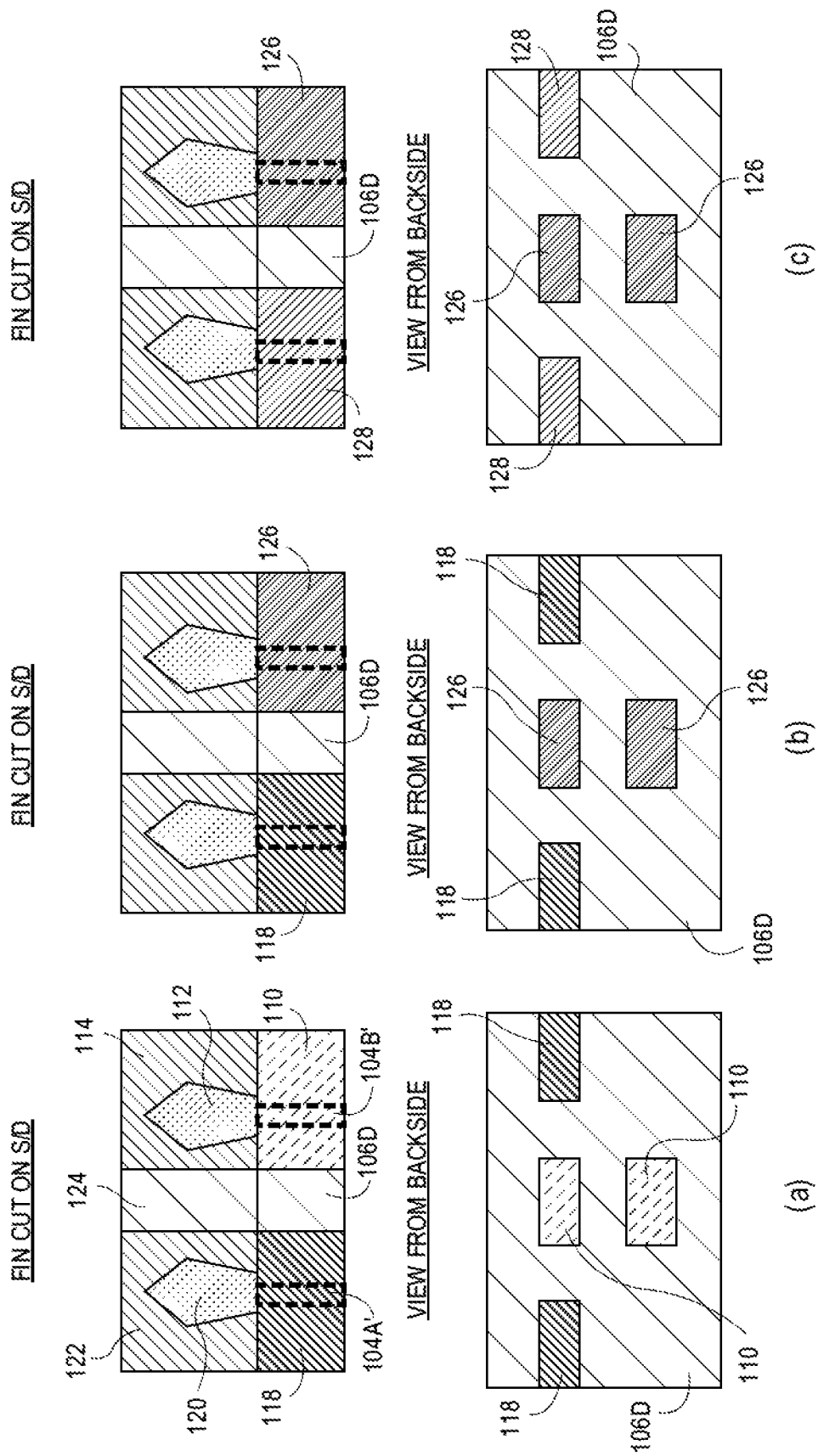
FIG. 2 illustrates cross-sectional views and corresponding backside plan views of various operations in a method of fabricating an integrated circuit structure having differentiated neighboring partitioned source or drain contact structures, in accordance with an embodiment of the present disclosure.

For further illustrative purposes, FIG. 2 illustrates cross-sectional views and corresponding backside plan views of various operations in a method of fabricating an integrated circuit structure having differentiated neighboring partitioned source or drain contact structures, in accordance with an embodiment of the present disclosure.

Referring to part (a) of FIG. 2, wafer bonding and grinding is performed on the structure of FIG. 1G to expose the sacrificial materials 110 and 118 and to reduce recessed STI region 106C to STI region 106D.

Referring to part (b) of FIG. 2, sacrificial material 110 is then removed and replaced with a bottom conductive contact structure 126. The bottom conductive contact structure 126 may be described as being self-aligned to the epitaxial source or drain structures 112 at a bottom surface of the epitaxial source or drain structures 112.

Referring to part (c) of FIG. 2, sacrificial material 118 is then removed and replaced with a bottom conductive contact structure 128. The bottom conductive contact structure 128 may be described as being self-aligned to the epitaxial source or drain structures 120 at a bottom surface of the epitaxial source or drain structures 120. It may be appreciated that, alternatively, sacrificial material 118 is replaced with bottom conductive contact structure 128 prior to replacing sacrificial material 110 with bottom conductive contact structure 126.

Referring again to FIG. 1J and FIG. 2, in accordance with an embodiment of the present disclosure, an integrated circuit structure includes a first fin 104A' and a second fin 104B'. A first gate stack is over the first fin 104A', and a second gate stack is over the second fin 104B' (as would be located into the page). A first epitaxial source or drain structure 120 is at a first end of the first fin 104A' (as depicted), and a second epitaxial source or drain structure 120 is at a second end of the first fin 104' (as would be located further into the page). A third epitaxial source or drain structure 112 is at a first end of the second fin 104B', and a fourth epitaxial source or drain structure 120 is at a second end of the second fin 104B' (as would be located further into the page).

A first conductive contact structure is coupled to one of the first or the second epitaxial source or drain structures 120, the first conductive contact structure having a first portion 122 partitioned from a second portion 128. A second conductive contact structure is coupled to one of the third or the fourth epitaxial source or drain structures 112, the second conductive contact structure having a first portion 114 partitioned from a second portion 126. In an embodiment, the second conductive contact structure is neighboring the first conductive contact structure and has a composition different than a composition of the first conductive contact structure, as is exemplified in FIG. 1J and part (c) of FIG. 2.

In an embodiment, the first portion 122 of the first conductive contact structure is on a first surface of the one of the first or the second epitaxial source or drain structures 120, and the second portion 128 of the first conductive contact structure is on a second surface of the one of the first or the second epitaxial source or drain structures 120, the second surface opposite the first surface. The first portion 114 of the second conductive contact structure is on a first surface of the one of the third or the fourth epitaxial source or drain structures 112, and the second portion 126 of the second conductive contact structure is on a second surface of the one of the third or the fourth epitaxial source or drain structures 112, the second surface opposite the first surface, as is depicted in FIG. 1J and part (c) of FIG. 2.

In an embodiment, as depicted, the first portion 122 of the first conductive contact structure is in contact with the second portion 128 of the first conductive contact structure, and the first portion 114 of the second conductive contact structure is in contact with the second portion 126 of the second conductive contact structure, as is depicted in FIG. 1J and part (c) of FIG. 2. In an alternative embodiment, not depicted, the first portion 122 of the first conductive contact structure is isolated from the second portion 128 of the first conductive contact structure, and the first portion 114 of the second conductive contact structure is isolated from the second portion 126 of the second conductive contact structure.

In an embodiment, the integrated circuit structure further includes a first backside interconnect (left 132) on the second portion 128 of the first conductive contact structure, and a second backside interconnect (right 132) on the second portion 126 of the second conductive contact structure, as is depicted. In an embodiment, the second portions 126 and 128 of the first and second conductive contact structures have a bottom surface co-planar with a bottom surface of the first and second fins 104A' and 104B', as is depicted.

In an embodiment, the first and second fins are first and second silicon fins. In an embodiment, wherein the first and second gate stacks each include a high-k gate dielectric layer and a metal gate electrode.

In another aspect, in accordance with other embodiments of the present disclosure, instead of fins, a nanowire, a stack of nanowires, a combination of a fin and a nanowire, or a combination of a fin and a stack of nanowires is implemented to form integrated circuit structures having differentiated neighboring partitioned source or drain contact structures. Examples of such arrangements, or portions thereof, are described in greater details below.

In another aspect, in order to enable backside access to one or both of a pair of differentiated neighboring partitioned source or drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back side, and again employed in back-side fabrication. Processing of both a front side and revealed back side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly, for example as illustrated in FIGS. 4A-4H and 5A-5H, described below. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 µm in thickness, 100-700 µm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate:intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectivity (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, backside processing may commence on an exposed backside of the device layer or specific device regions there in. In some embodiments, the backside device layer processing includes a further polish or wet/dry etch through a thickness of the device layer disposed between the intervening layer and a device region previously fabricated in the device layer, such as a source or drain region.

In some embodiments where the carrier layer, intervening layer, or device layer backside is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back side of an intervening layer, a back side of the device layer, and/or back side of one or more semiconductor regions within the device layer, and/or front-side metallization revealed. Additional backside processing of any of these revealed regions may then be performed during downstream processing.

It is to be appreciated that the structures resulting from the above exemplary processing schemes may be used in a same or similar form for subsequent processing operations to complete device fabrication, such as PMOS and/or NMOS device fabrication. As an example of a completed device, FIG. 3 illustrate a cross-sectional view of a non-planar integrated circuit structure as taken along a gate line, in accordance with an embodiment of the present disclosure.

Figure 3:
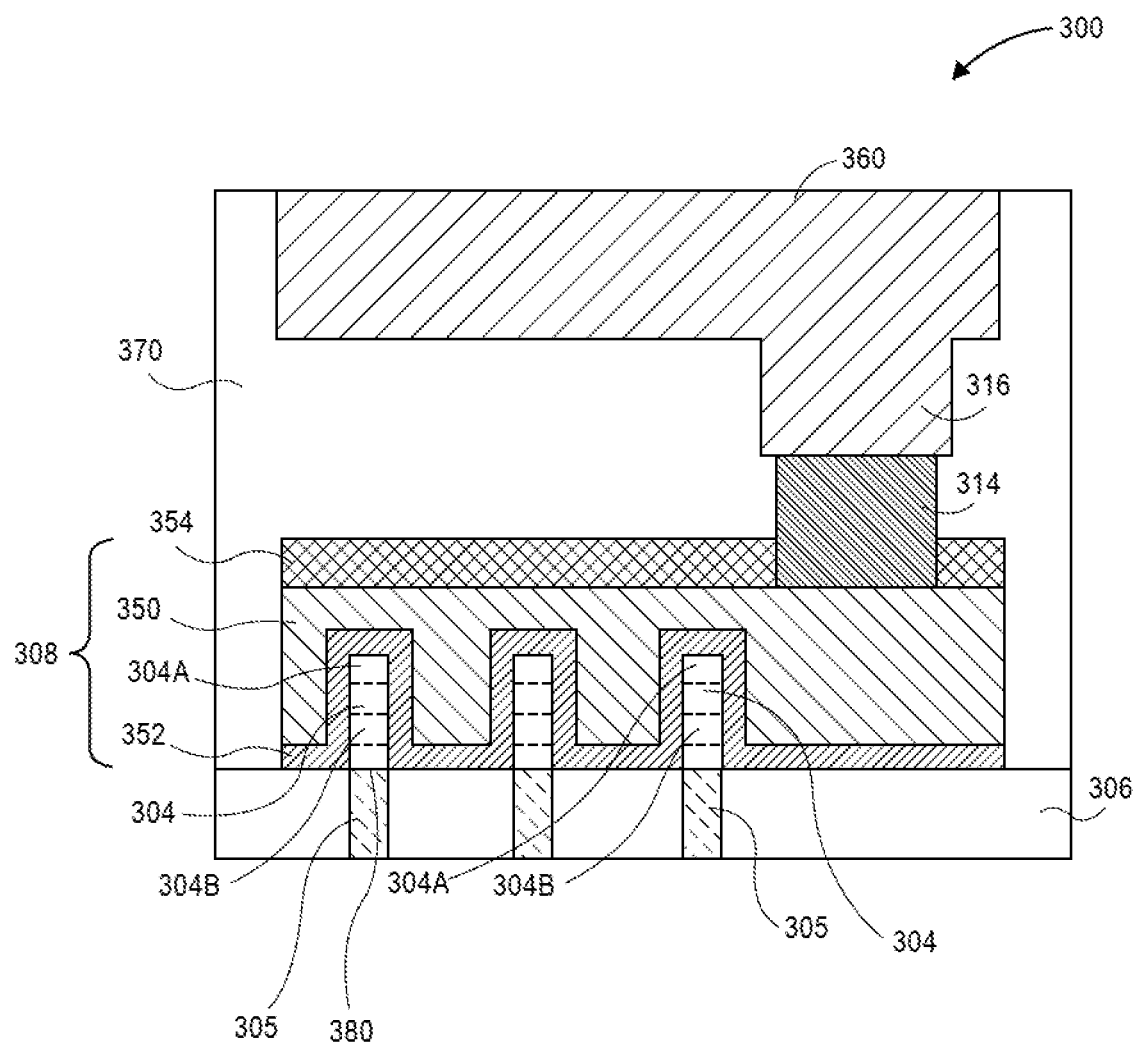
FIG. 3 illustrates a cross-sectional view of a non-planar integrated circuit structure as taken along a gate line, in accordance with an embodiment of the present disclosure.

Referring to FIG. 3, a semiconductor structure or device 300 includes a non-planar active region (e.g., a fin structure including protruding fin portion 304 and sub-fin region 305) within a trench isolation region 306. In an embodiment, instead of a solid fin, the non-planar active region is separated into nanowires (such as nanowires 304A and 304B) above sub-fin region 305, as is represented by the dashed lines. In either case, for ease of description for non-planar integrated circuit structure 300, a non-planar active region 304 is referenced below as a protruding fin portion.

A gate line 308 is disposed over the protruding portions 304 of the non-planar active region (including, if applicable, surrounding nanowires 304A and 304B), as well as over a portion of the trench isolation region 306. As shown, gate line 308 includes a gate electrode 350 and a gate dielectric layer 352. In one embodiment, gate line 308 may also include a dielectric cap layer 354. A gate contact 314, and overlying gate contact via 316 are also seen from this perspective, along with an overlying metal interconnect 360, all of which are disposed in inter-layer dielectric stacks or layers 370. Also seen from the perspective of FIG. 3, the gate contact 314 is, in one embodiment, disposed over trench isolation region 306, but not over the non-planar active regions.

In an embodiment, the semiconductor structure or device 300 is a non-planar device such as, but not limited to, a fin-FET device, a tri-gate device, a nanoribbon device, or a nano-wire device. In such an embodiment, a corresponding semiconducting channel region is composed of or is formed in a three-dimensional body. In one such embodiment, the gate electrode stacks of gate lines 308 surround at least a top surface and a pair of sidewalls of the three-dimensional body.

As is also depicted in FIG. 3, in an embodiment, an interface 380 exists between a protruding fin portion 304 and sub-fin region 305. The interface 380 can be a transition region between a doped sub-fin region 305 and a lightly or undoped upper fin portion 304. In one such embodiment, each fin is approximately 10 nanometers wide or less, and sub-fin dopants are supplied from an adjacent solid state doping layer at the sub-fin location. In a particular such embodiment, each fin is less than 10 nanometers wide. However, fins may be wider than 10 nanometers.

Although not depicted in FIG. 3, it is to be appreciated that source or drain regions of or adjacent to the protruding fin portions 304 are on either side of the gate line 308, i.e., into and out of the page. In one embodiment, the source or drain regions are doped portions of original material of the protruding fin portions 304. In another embodiment, the material of the protruding fin portions 304 is removed and replaced with another semiconductor material, e.g., by epitaxial deposition to form discrete epitaxial nubs or non-discrete epitaxial structures. In either embodiment, the source or drain regions may extend below the height of dielectric layer of trench isolation region 306, i.e., into the sub-fin region 305. In accordance with an embodiment of the present disclosure, the more heavily doped sub-fin regions, i.e., the doped portions of the fins below interface 380, inhibits source to drain leakage through this portion of the bulk semiconductor fins. In accordance with one or more embodiments of the present disclosure, one or both of the source and drain regions have an associated partitioned source or drain contact structure, which may be one of a pair of differentiated neighboring partitioned source or drain contact structures, as described above in association with FIGS. 1J and 2.

In an embodiment, alternatively, sub-fin region 305 can be etched away from the back side and filled in with a dielectric material. The fin can be removed in both the sub gate and source drain regions, or in the case that the sacrificial front side patterned S/D etch removed fins the back side sub fin isolation would be in the gate only region. In the case of nanowires, in one embodiment, the sub-fin does not need to be doped or isolated due to the inherent isolation of the wire/ribbon structure.

With reference again to FIG. 3, in an embodiment, fins 304/305 (and, possibly nanowires 304A and 304B) are composed of a crystalline silicon, silicon/germanium or germanium layer doped with a charge carrier, such as but not limited to phosphorus, arsenic, boron or a combination thereof. In one embodiment, the concentration of silicon atoms is greater than 93%. In another embodiment, fins 304/305 are composed of a group III-V material, such as, but not limited to, gallium nitride, gallium phosphide, gallium arsenide, indium phosphide, indium antimonide, indium gallium arsenide, aluminum gallium arsenide, indium gallium phosphide, or a combination thereof. Trench isolation region 306 may be composed of a dielectric material such as, but not limited to, silicon dioxide, silicon oxy-nitride, silicon nitride, or carbon-doped silicon nitride.

Gate line 308 may be composed of a gate electrode stack which includes a gate dielectric layer 352 and a gate electrode layer 350. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate fin 304. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 314 and overlying gate contact via 316 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 308 is formed while eliminating the use of a lithographic step with exceedingly tight registration budget. In an embodiment, the contact pattern is a contact pattern having one or more partitioned contact structures, which may be one of a pair of differentiated neighboring partitioned source or drain contact structures, as described above in association with FIGS. 1J and 2. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In one embodiment, a first sacrificial material is patterned only where a certain (e.g., NMOS) backside S/D contact is needed, and a second sacrificial material is patterned only where a certain other (e.g., PMOS) backside S/D contact is needed. Backside patterning may not require lithography and etch selectivity alone can define the formation of needed back side contacts, as exemplified in FIG. 2.

In another embodiment, a first sacrificial material and a second sacrificial material are present in all S/D regions and are lithographically defined from the backside. In areas where a direct back side metallic contact is not needed, lithography can be used to define the sacrificial material that can be removed and replaced with a single leave behind dielectric material. In areas where a contact is needed, the first sacrificial material can be removed selective to the second sacrificial material. A first contact can be formed (including, e.g., NMOS contact process), then the second sacrificial material can be removed selective to the first contact. A second contact can then be formed (e.g., for a PMOS contact).

In an embodiment, in the case that the sacrificial materials can also be leave-behind dielectrics, then lithography can be used to define the two populations of contact that need to be open and they can be removed selectively or not selectively to each other. For example, lithography is used to expose the first sacrificial material areas and they can be removed, and the first contact can be formed (including for example NMOS contact process). The second sacrificial material can then be removed selective to the first contact. A second contact can then be formed (for example, a PMOS contact).

In an embodiment, providing structure 300 involves fabrication of the gate stack structure 308 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

Referring again to FIG. 3, the arrangement of semiconductor structure or device 300 places the gate contact over isolation regions. Such an arrangement may be viewed as inefficient use of layout space. In another embodiment, however, a semiconductor device has contact structures that contact portions of a gate electrode formed over an active region, e.g., over a sub-fin 305, and in a same layer as a trench contact via.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In accordance with one or more embodiments of the present disclosure, in order to enable backside access to a partitioned source or drain contact structure, which may be one of a pair of differentiated neighboring partitioned source or drain contact structures, as described above in association with FIGS. 1J and 2, a double-sided device processing scheme may be practiced at the wafer-level. In some exemplary embodiments, a large formal substrate (e.g., 300 or 450 mm diameter) wafer may be processed. In an exemplary processing scheme, a donor substrate including a device layer is provided. In some embodiments, the device layer is a semiconductor material that is employed by an IC device. As one example, in a transistor device, such as a field effect transistor (FET), the channel semiconductor is formed from the semiconductor device layer. As another example, for an optical device, such as a photodiode, the drift and/or gain semiconductor is formed from the device layer. The device layer may also be employed in a passive structure with an IC device. For example, an optical waveguide may employ semiconductor patterned from the device layer.

In some embodiments, the donor substrate includes a stack of material layers. Such a material stack may facilitate subsequent formation of an IC device stratum that includes the device layer but lacks other layers of the donor substrate. In an exemplary embodiment, the donor substrate includes a carrier layer separated from the device layer by one or more intervening material layers. The carrier layer is to provide mechanical support during front-side processing of the device layer. The carrier may also provide the basis for crystallinity in the semiconductor device layer. The intervening layer(s) may facilitate removal of the carrier layer and/or the reveal of the device layer backside.

Front-side fabrication operations are then performed to form a device structure that includes one or more regions in the device layer. Any known front-side processing techniques may be employed to form any known IC device and exemplary embodiments are further described elsewhere herein. A front side of the donor substrate is then joined to a host substrate to form a device-host assembly. The host substrate is to provide front-side mechanical support during back-side processing of the device layer. The host substrate may also entail integrated circuitry with which the IC devices fabricated on the donor substrate are interconnected. For such embodiments, joining of the host and donor substrate may further entail formation of 3D interconnect structures through hybrid (dielectric/metal) bonding. Any known host substrate and wafer-level joining techniques may be employed.

The process flow continues where the back side of the device stratum is revealed by removing at least a portion of the carrier layer. In some further embodiments, portions of any intervening layer and/or front-side materials deposited over the device layer may also be removed during the reveal operation. As described elsewhere herein in the context of some exemplary embodiments, an intervening layer(s) may facilitate a highly-uniform exposure of the device stratum back-side, for example serving as one or more of an etch marker or etch stop employed in the wafer-level backside reveal process. Device stratum surfaces exposed from the back side are processed to form a double-side device stratum. Native materials, such as any of those of the donor substrate, which interfaced with the device regions may then be replaced with one or more non-native materials. For example, a portion of a semiconductor device layer or intervening layer may be replaced with one or more other semiconductor, metal, or dielectric materials. In some further embodiments, portions of the front-side materials removed during the reveal operation may also be replaced. For example, a portion of a dielectric spacer, gate stack, or contact metallization formed during front-side device fabrication may be replaced with one or more other semiconductor, metal, or dielectric materials during backside deprocessing/reprocessing of the front-side device. In still other embodiments, a second device stratum or metal interposer is bonded to the reveal back-side.

The above process flow provides a device stratum-host substrate assembly. The device stratum-host assembly may then be further processed. For example, any known technique may be employed to singulate and package the device stratum-host substrate assembly. Where the host substrate is entirely sacrificial, packaging of the device stratum-host substrate may entail separation of the host substrate from the device stratum. Where the host substrate is not entirely sacrificial (e.g., where the host substrate also includes a device stratum), the device stratum-host assembly output may be fed back as a host substrate input during a subsequent iteration of the above process flow. Iteration of the above approach may thus form a wafer-level assembly of any number of double-side device strata, each only tens or hundreds of nanometers in thickness, for example. In some embodiments, and as further described elsewhere herein, one or more device cells within a device stratum are electrically tested, for example as a yield control point in the fabrication of a wafer-level assembly of double-side device strata. In some embodiments, the electrical test entails back-side device probing.

FIGS. 4A-4H illustrate plan views of a substrate processed with double-sided device processing methods, in accordance with some embodiments. FIGS. 5A-5H illustrate cross-sectional views of a substrate processed with double-sided device processing methods, in accordance with some embodiments.

Figure 4A:
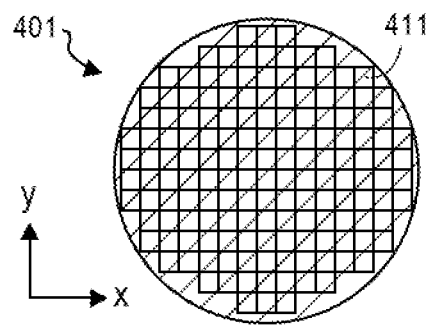
FIGS. 4A-4H illustrate plan views of a substrate processed with double-sided device processing methods, in accordance with some embodiments.
Figure 5A:
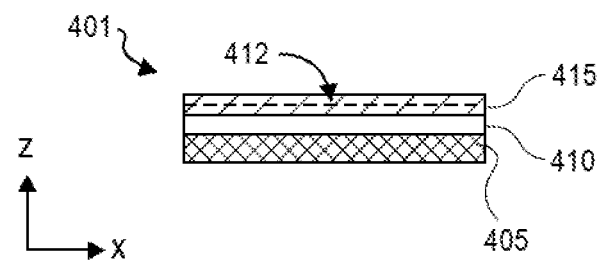
FIGS. 5A-5H illustrate cross-sectional views of a substrate processed with double-sided device processing methods, in accordance with some embodiments.

As shown in FIGS. 4A and 5A, donor substrate 401 includes a plurality of IC die 411 in an arbitrary spatial layout over a front-side wafer surface. Front-side processing of IC die 411 may have been performed following any techniques to form any device structures. In exemplary embodiments, die 411 include one or more semiconductor regions within device layer 415. An intervening layer 410 separates device layer 415 from carrier layer 405. In the exemplary embodiment, intervening layer 410 is in direct contact with both carrier layer 405 and device layer 415. Alternatively, one or more spacer layers may be disposed between intervening layer 410 and device layer 415 and/or carrier layer 405. Donor substrate 401 may further include other layers, for example disposed over device layer 415 and/or below carrier layer 405.

Device layer 415 may include one or more layers of any device material composition known to be suitable for a particular IC device, such as, but not limited to, transistors, diodes, and resistors. In some exemplary embodiments, device layer 415 includes one or more group IV (i.e., IUPAC group 14) semiconductor material layers (e.g., Si, Ge, SiGe), group III-V semiconductor material layers (e.g., GaAs, InGaAs, InAs, InP), or group III-N semiconductor material layers (e.g., GaN, AlGaN, InGaN). Device layer 415 may also include one or more semiconductor transition metal dichalcogenide (TMD or TMDC) layers. In other embodiments, device layer 415 includes one or more graphene layer, or a graphenic material layer having semiconductor properties. In still other embodiments, device layer 415 includes one or more oxide semiconductor layers. Exemplary oxide semiconductors include oxides of a transition metal (e.g., IUPAC group 4-10) or post-transition metal (e.g., IUPAC groups 11-14). In advantageous embodiments, the oxide semiconductor includes at least one of Cu, Zn, Sn, Ti, Ni, Ga, In, Sr, Cr, Co, V, or Mo. The metal oxides may be suboxides ($A_2O$) monoxides (AO), binary oxides ($AO_2$), ternary oxides ($ABO_3$), and mixtures thereof. In other embodiments, device layer 415 includes one or more magnetic, ferromagnetic, ferroelectric material layer. For example device layer 415 may include one or more layers of any material known to be suitable for an tunneling junction device, such as, but not limited to a magnetic tunneling junction (MTJ) device.

In some embodiments, device layer 415 is substantially monocrystalline. Although monocrystalline, a significant number of crystalline defects may nonetheless be present. In other embodiments, device layer 415 is amorphous or nanocrystalline. Device layer 415 may be any thickness (e.g., z-dimension in FIG. 5A). In some exemplary embodiments, device layer 415 has a thickness greater than a z-thickness of at least some of the semiconductor regions employed by die 411 as functional semiconductor regions of die 411 built on and/or embedded within device layer 415 need not extend through the entire thickness of device layer 415. In some embodiments, semiconductor regions of die 411 are disposed only within a top-side thickness of device layer 415 demarked in FIG. 5A by dashed line 412. For example, semiconductor regions of die 411 may have a z-thickness of 200-300 nm, or less, while device layer may have a z-thickness of 700-1000 nm, or more. As such, around 600 nm of device layer thickness may separate semiconductor regions of die 411 from intervening layer 410.

Carrier layer 405 may have the same material composition as device layer 415, or may have a material composition different than device layer 415. For embodiments where carrier layer 405 and device layer 415 have the same composition, the two layers may be identified by their position relative to intervening layer 410. In some embodiments where device layer 415 is a crystalline group IV, group III-V or group III-N semiconductor, carrier layer 405 is the same crystalline group IV, group III-V or group III-N semiconductor as device layer 415. In alternative embodiments, where device layer 415 is a crystalline group IV, group III-V or group III-N semiconductor, carrier layer 405 is a different crystalline group IV, group III-V or group III-N semiconductor than device layer 415. In still other embodiments, carrier layer 405 may include, or be, a material onto which device layer 415 transferred, or grown upon. For example, carrier layer may include one or more amorphous oxide layers (e.g., glass) or crystalline oxide layer (e.g., sapphire), polymer sheets, or any material(s) built up or laminated into a structural support known to be suitable as a carrier during IC device processing. Carrier layer 405 may be any thickness (e.g., z-dimension in FIG. 5A) as a function of the carrier material properties and the substrate diameter. For example, where the carrier layer 405 is a large format (e.g., 300-450 mm) semiconductor substrate, the carrier layer thickness may be 700-1000 μm, or more.

In some embodiments, one or more intervening layers 410 are disposed between carrier layer 405 and device layer 415. In some exemplary embodiments, an intervening layer 410 is compositionally distinct from carrier layer 405 such that it may serve as a marker detectable during subsequent removal of carrier layer 405. In some such embodiments, an intervening layer 410 has a composition that, when exposed to an etchant of carrier layer 405 will etch at a significantly slower rate than carrier layer 405 (i.e., intervening layer 410 functions as an etch stop for a carrier layer etch process). In further embodiments, intervening layer 410 has a composition distinct from that of device layer 415. Intervening layer 410 may be a metal, semiconductor, or dielectric material, for example.

In some exemplary embodiments where at least one of carrier layer 405 and device layer 415 are crystalline semiconductors, intervening layer 410 is also a crystalline semiconductor layer. Intervening layer 410 may further have the same crystallinity and crystallographic orientation as carrier layer 405 and/or device layer 415. Such embodiments may have the advantage of reduced donor substrate cost relative to alternative embodiments where intervening layer 410 is a material that necessitates bonding (e.g., thermal-compression bonding) of intervening layer 410 to intervening layer 410 and/or to carrier layer 405.

For embodiments where intervening layer 410 is a semiconductor, one or more of the primary semiconductor lattice elements, alloy constituents, or impurity concentrations may vary between at least carrier layer 405 and intervening layer 410. In some embodiments where at least carrier layer 405 is a group IV semiconductor, intervening layer 410 may also be a group IV semiconductor, but of a different group IV element or alloy and/or doped with an impurity species to an impurity level different than that of carrier layer 405. For example, intervening layer 410 may be a silicon-germanium alloy epitaxially grown on a silicon carrier. For such embodiments, a pseudomorphic intervening layer may be grown heteroepitaxially to any thickness below the critical thickness. Alternatively, the intervening layer 410 may be a relaxed buffer layer having a thickness greater than the critical thickness.

In other embodiments, where at least carrier layer 405 is a group III-V semiconductor, intervening layer 410 may also be a group III-V semiconductor, but of a different group III-V alloy and/or doped with an impurity species to an impurity level different than that of carrier layer 405. For example, intervening layer 410 may be an AlGaAs alloy epitaxially grown on a GaAs carrier. In some other embodiments where both carrier layer 405 and device layer 415 are crystalline semiconductors, intervening layer 410 is also a crystalline semiconductor layer, which may further have the same crystallinity and crystallographic orientation as carrier layer 405 and/or device layer 415.

In embodiments where both carrier layer 405 and intervening layer 410 are of the same or different primary semiconductor lattice elements, impurity dopants may differentiate the carrier and intervening layer. For example, intervening layer 410 and carrier layer 405 may both be silicon crystals with intervening layer 410 lacking an impurity present in carrier layer 405, or doped with an impurity absent from carrier layer 405, or doped to a different level with an impurity present in carrier layer 405. The impurity differentiation may impart etch selectivity between the carrier and intervening layer, or merely introduce a detectable species.

Intervening layer 410 may be doped with impurities that are electrically active (i.e., rendering it an n-type or p-type semiconductor), or not, as the impurity may provide any basis for detection of the intervening layer 410 during subsequent carrier removal. Exemplary electrically active impurities for some semiconductor materials include group III elements (e.g., B), group IV elements (e.g., P). Any other element may be employed as a non-electrically active species. Impurity dopant concentration within intervening layer 410 need only vary from that of carrier layer 405 by an amount sufficient for detection, which may be predetermined as a function of the detection technique and detector sensitivity.

As described further elsewhere herein, intervening layer 410 may have a composition distinct from device layer 415. In some such embodiments, intervening layer 410 may have a different band gap than that of device layer 415. For example, intervening layer 410 may have a wider band-gap than device layer 415.

In embodiments where intervening layer 410 includes a dielectric material, the dielectric material may be an inorganic material (e.g., SiO, SiN, SiON, SiOC, hydrogen silsesquioxane, methyl silsesquioxane) or organic material (polyimide, polynorbornenes, benzocyclobutene). For some dielectric embodiments, intervening layer 410 may be formed as an embedded layer (e.g., SiOx through implantation of oxygen into a silicon device and/or carrier layer). Other embodiments of a dielectric intervening layer may necessitate bonding (e.g., thermal-compression bonding) of carrier layer 405 to device layer 415. For example, where donor substrate 401 is a semiconductor-on-oxide (SOI) substrate, either or both of carrier layer 405 and device layer 415 may be oxidized and bonded together to form a SiO intervening layer 410. Similar bonding techniques may be employed for other inorganic or organic dielectric materials.

In some other embodiments, intervening layer 410 includes two or more materials laterally spaced apart within the layer. The two or more materials may include a dielectric and a semiconductor, a dielectric and a metal, a semiconductor and a metal, a dielectric and a metal, two different dielectric, two different semiconductors, or two different metals. Within such an intervening layer, a first material may surround islands of the second material that extend through the thickness of the intervening layer. For example, an intervening layer may include a field isolation dielectric that surrounds islands of semiconductor, which extend through the thickness of the intervening layer. The semiconductor may be epitaxially grown within openings of a patterned dielectric or the dielectric material may be deposited within openings of a patterned semiconductor.

In some exemplary embodiments, semiconductor features, such as fins or mesas, are etched into a front-side surface of a semiconductor device layer. Trenches surrounding these features may be subsequently backfilled with an isolation dielectric, for example following any known shallow trench isolation (STI) process. One or more of the semiconductor feature or isolation dielectric may be employed for terminating a back-side carrier removal process, for example as a back-side reveal etch stop. In some embodiments, a reveal of trench isolation dielectric may stop, significantly retard, or induce a detectable signal for terminating a back-side carrier polish. For example, a CMP polish of carrier semiconductor employing a slurry that has high selectivity favoring removal of carrier semiconductor (e.g., Si) over removal of isolation dielectric (e.g., SiO) may be significantly slowed upon exposure of a (bottom) surface of the trench isolation dielectric surrounding semiconductor features including the device layer. Because the device layer is disposed on a front side of intervening layer, the device layer need not be directly exposed to the back-side reveal process.

Notably, for embodiments where the intervening layer includes both semiconductor and dielectric, the intervening layer thickness may be considerably greater than the critical thickness associated with the lattice mismatch of the intervening layer and carrier. Whereas an intervening layer below critical thickness may be an insufficient thickness to accommodate non-uniformity of a wafer-level back-side reveal process, embodiments with greater thickness may advantageously increase the back-side reveal process window. Embodiments with pin-holed dielectric may otherwise facilitate subsequent separation of carrier and device layers as well as improve crystal quality within the device layer.

Semiconductor material within intervening layers that include both semiconductor and dielectric may also be homoepitaxial. In some exemplary embodiments, a silicon epitaxial device layer is grown through a pin-holed dielectric disposed over a silicon carrier layer.

Continuing with description of FIGS. 4A and 5A, intervening layer 410 may also be a metal. For such embodiments, the metal may be of any composition known to be suitable for bonding to carrier layer 405 or device layer 415. For example, either or both of carrier layer 405 and device layer 415 may be finished with a metal, such as, but not limited to Au or Pt, and subsequently bonded together, for example to form an Au or Pt intervening layer 410. Such a metal may also be part of an intervening layer that further includes a patterned dielectric surrounding metal features.

Intervening layer 410 may be of any thickness (e.g., z-height in FIG. 5A). The intervening layer should be sufficiently thick to ensure the carrier removal operation can be reliably terminated before exposing device regions and/or device layer 415. Exemplary thicknesses for intervening layer 410 range from a few hundred nanometers to a few micrometers and may vary as a function of the amount of carrier material that is to be removed, the uniformity of the carrier removal process, and the selectivity of the carrier removal process, for example. For embodiments where the intervening layer has the same crystallinity and crystallographic orientation as carrier layer 405, the carrier layer thickness may be reduced by the thickness of intervening layer 410. In other words, intervening layer 410 may be a top portion of a 700-1000 µm thick group IV crystalline semiconductor substrate also employed as the carrier layer. In pseudomorphic heteroepitaxial embodiments, intervening layer thickness may be limited to the critical thickness. For heteroepitaxial intervening layer embodiments employing aspect ratio trapping (ART) or another fully relaxed buffer architecture, the intervening layer may have any thickness.

Figure 4B:
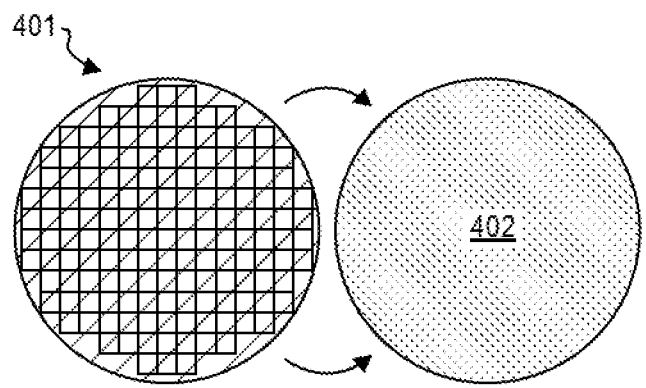
Figure 5B:
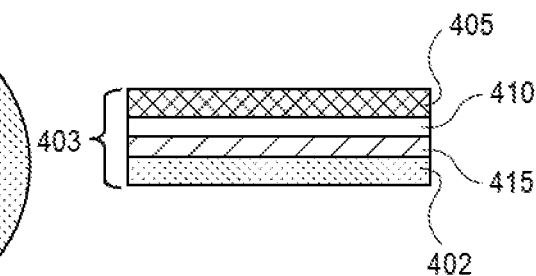

As further illustrated in FIGS. 4B and 5B, donor substrate 401 may be joined to a host substrate 402 to form a donor-host substrate assembly 403. In some exemplary embodiments, a front-side surface of donor substrate 401 is joined to a surface of host substrate 402 such that device layer 415 is proximal host substrate 402 and carrier layer 405 is distal from host substrate 402. Host substrate 402 may be any substrate known to be suitable for joining to device layer 415 and/or a front-side stack fabricated over device layer 415. In some embodiments, host substrate 402 includes one or more additional device strata. For example, host substrate 402 may further include one or more device layer (not depicted). Host substrate 402 may include integrated circuitry with which the IC devices fabricated in a device layer of host substrate 402 are interconnected, in which case joining of device layer 415 to host substrate 402 may further entail formation of 3D interconnect structures through the wafer-level bond.

Although not depicted in detail by FIG. 5B, any number of front-side layers, such as interconnect metallization levels and interlayer dielectric (ILD) layers, may be present between device layer 415 and host substrate 402. Any technique may be employed to join host substrate 402 and donor substrate 401. In some exemplary embodiments further described elsewhere herein, the joining of donor substrate 401 to host substrate 402 is through metal-metal, oxide-oxide, or hybrid (metal/oxide-metal/oxide) thermal compression bonding.

Figure 4C:
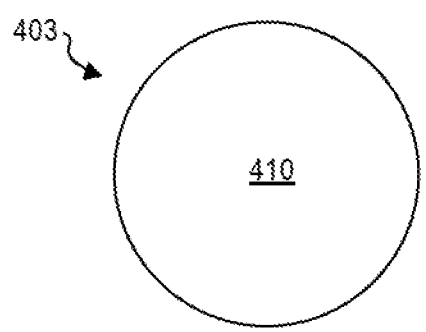
Figure 5C:
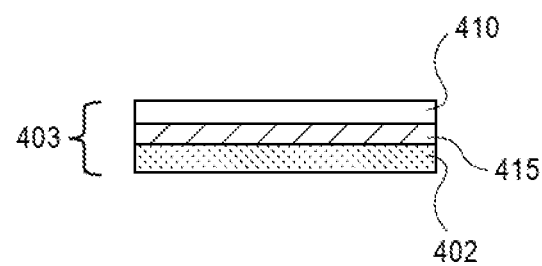

With host substrate 402 facing device layer 415 on a side opposite carrier layer 405, at least a portion of carrier layer 405 may be removed as further illustrated in FIGS. 4C and 5C. Where the entire carrier layer 405 is removed, donor-host substrate assembly 403 maintains a highly uniform thickness with planar back side and front side surfaces. Alternatively, carrier layer 405 may be masked and intervening layer 410 exposed only in unmasked sub-regions to form a non-planar back side surface. In the exemplary embodiments illustrated by FIGS. 4C and 5C, carrier layer 405 is removed from the entire back-side surface of donor-host substrate assembly 403. Carrier layer 405 may be removed, for example by cleaving, grinding, and/or polishing (e.g., chemical-mechanical polishing), and/or wet chemical etching, and/or plasma etching through a thickness of the carrier layer to expose intervening layer 410. One or more operations may be employed to remove carrier layer 405. Advantageously, the removal operation(s) may be terminated based on duration or an endpoint signal sensitive to exposure of intervening layer 410.

Figure 4D:
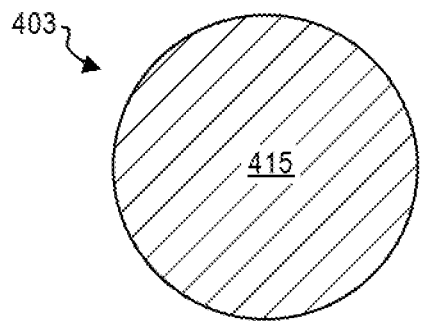
Figure 5D:
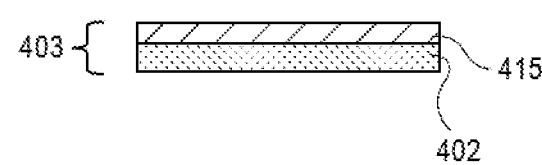

In further embodiments, for example as illustrated by FIGS. 4D and 5D, intervening layer 410 is also at least partially etched to expose a back side of device layer 415. At least a portion of intervening layer 410 may be removed subsequent to its use as a carrier layer etch stop and/or carrier layer etch endpoint trigger. Where the entire intervening layer 410 is removed, donor-host substrate assembly 403 maintains a highly uniform device layer thickness with planar back-side and front-side surfaces afforded by the intervening layer being much thinner than the carrier layer. Alternatively, intervening layer 410 may be masked and device layer 415 exposed only in unmasked sub-regions, thereby forming a non-planar back-side surface. In the exemplary embodiments illustrated by FIGS. 4D and 5D, intervening layer 410 is removed from the entire back-side surface of donor-host substrate assembly 403. Intervening layer 410 may be so removed, for example, by polishing (e.g., chemical-mechanical polishing), and/or blanket wet chemical etching, and/or blanket plasma etching through a thickness of the intervening layer to expose device layer 415. One or more operations may be employed to remove intervening layer 410. Advantageously, the removal operation(s) may be terminated based on duration or an endpoint signal sensitive to exposure of device layer 415.

Figure 4E:
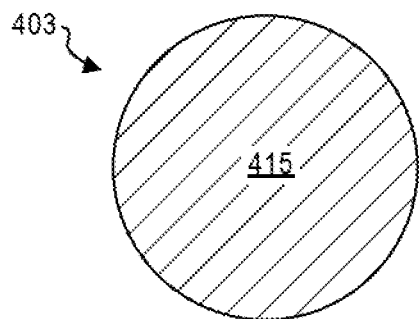
Figure 5E:
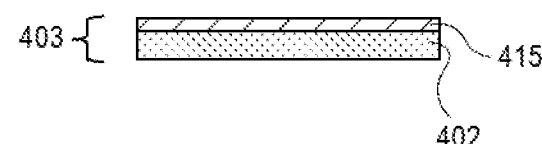
Figure 4F:
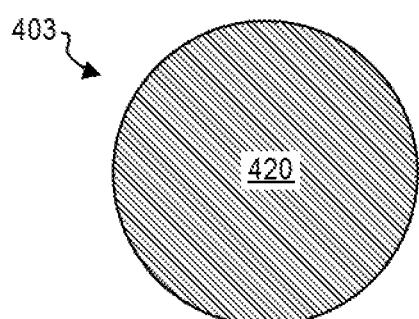
Figure 5F:
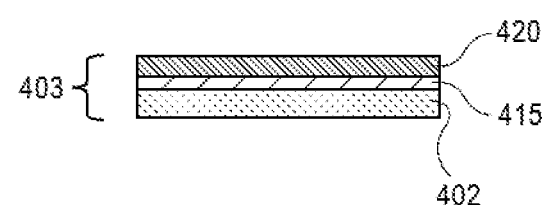
Figure 4G:
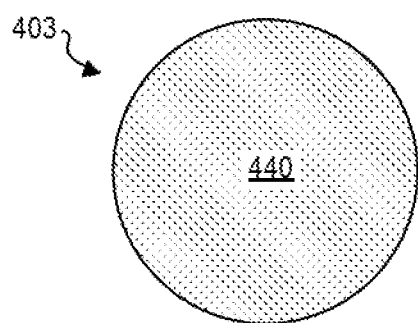
Figure 5G:
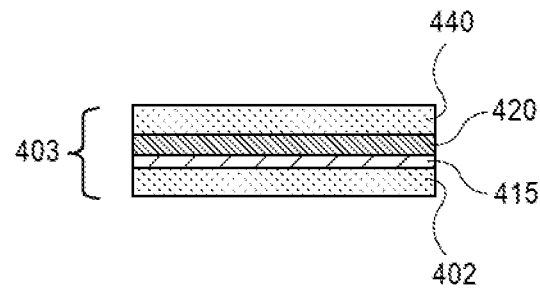
Figure 4H:
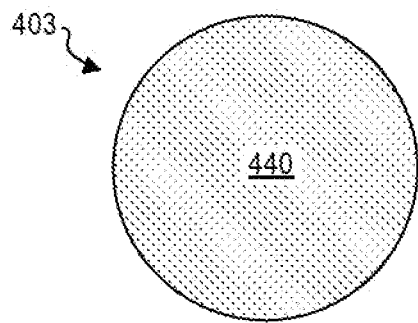
Figure 5H:
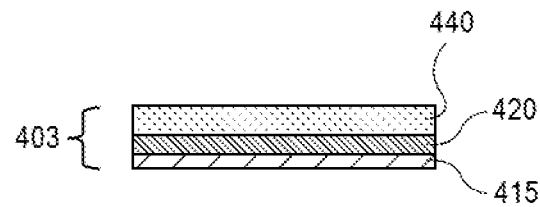

In some further embodiments, for example as illustrated by FIGS. 4E and 5E, device layer 415 is partially etched to expose a back side of a device structure previously formed from during front-side processing. At least a portion of device layer 415 may be removed subsequent to its use in fabricating one or more of the device semiconductor regions, and/or its use as an intervening layer etch stop or endpoint trigger. Where device layer 415 is thinned over the entire substrate area, donor-host substrate assembly 403 maintains a highly uniform reduced thickness with planar back and front surfaces. Alternatively, device layer 415 may be masked and device structures (e.g., device semiconductor regions) selectively revealed only in unmasked sub-regions, thereby forming a non-planar back-side surface. In the exemplary embodiments illustrated by FIGS. 4E and 5E, device layer 415 is thinned over the entire back-side surface of donor-host substrate assembly 403. Device layer 415 may be thinned, for example by polishing (e.g., chemical-mechanical polishing), and/or wet chemical etching, and/or plasma etching through a thickness of the device layer to expose one or more device semiconductor regions, and/or one or more other device structures (e.g., front-side device terminal contact metallization, spacer dielectric, etc.) previously formed during front-side processing. One or more operations may be employed to thin device layer 415. Advantageously, the device layer thinning may be terminated based on duration or an endpoint signal sensitive to exposure of patterned features within device layer 415. For example, where front-side processing forms device isolation features (e.g., shallow trench isolation), back-side thinning of device layer 415 may be terminated upon exposing the isolation dielectric material.

A non-native material layer may be deposited over a back-side surface of an intervening layer, device layer, and/or specific device regions within device layer 415, and/or over or more other device structures (e.g., front-side device terminal contact metallization, spacer dielectric, etc.). One or more materials exposed (revealed) from the backside may be covered with non-native material layer or replaced with such a material. In some embodiments, illustrated by FIGS. 4F and 5F, non-native material layer 420 is deposited on device layer 415. Non-native material layer 420 may be any material having a composition and/or microstructure distinct from that of the material removed to reveal the backside of the device stratum. For example, where intervening layer 410 is removed to expose device layer 415, non-native material layer 420 may be another semiconductor of different composition or microstructure than that of intervening layer 410. In some such embodiments where device layer 415 is a III-N semiconductor, non-native material layer 420 may also be a III-N semiconductor of the same or different composition that is regrown upon a revealed backside surface of a III-N device region.

This material may be epitaxially regrown from the revealed III-N device region, for example, to have better crystal quality than that of the material removed, and/or to induce strain within the device layer and/or device regions within the device layer, and/or to form a vertical (e.g., z-dimension) stack of device semiconductor regions suitable for a stacked device.

In some other embodiments where device layer 415 is a III-V semiconductor, non-native material layer 420 may also be a III-V semiconductor of the same or different composition that is regrown upon a revealed backside surface of a III-V device region. This material may be epitaxially regrown from the revealed III-V device region, for example, to have relatively better crystal quality than that of the material removed, and/or to induce strain within the device layer or a specific device region within the device layer, and/or to form a vertical stack of device semiconductor regions suitable for a stacked device.

In some other embodiments where device layer 415 is a group IV semiconductor, non-native material layer 420 may also be a group IV semiconductor of the same or different composition that is regrown upon a revealed backside surface of a group IV device region. This material may be epitaxially regrown from the revealed group IV device region, for example, to have relatively better crystal quality than that of the material removed, and/or to induce strain within the device region, and/or to form a stack of device semiconductor regions suitable for a stacked device.

In some other embodiments, non-native material layer 420 is a dielectric material, such as, but not limited to SiO, SiON, SiOC, hydrogen silsesquioxane, methyl silsesquioxane, polyimide, polynorbornenes, benzocyclobutene, or the like. Deposition of such a dielectric may serve to electrically isolate various device structures, such as semiconductor device regions, that may have been previously formed during front-side processing of donor substrate 401.

In some other embodiments, non-native material layer 420 is a conductive material, such as any elemental metal or metal alloy known to be suitable for contacting one or more surfaces of device regions revealed from the backside. In some embodiments, non-native material layer 420 is a metallization suitable for contacting a device region revealed from the backside, such as a transistor source or drain region.

In some embodiments, non-native material layer 420 is a stack of materials, such as a FET gate stack that includes both a gate dielectric layer and a gate electrode layer. As one example, non-native material layer 420 may be a gate dielectric stack suitable for contacting a semiconductor device region revealed from the backside, such as a transistor channel region. Any of the other the materials described as options for device layer 415 may also be deposited over a backside of device layer 415 and/or over device regions formed within device layer 415. For example, non-native material layer 420 may be any of the oxide semiconductors, TMDC, or tunneling materials described above, which may be deposited on the back-side, for example, to incrementally fabricate vertically-stacked device strata.

Back-side wafer-level processing may continue in any manner known to be suitable for front-side processing. For example, non-native material layer 420 may be patterned into active device regions, device isolation regions, device contact metallization, or device interconnects using any known lithographic and etch techniques. Back-side wafer-level processing may further fabricate one or more interconnect metallization levels coupling terminals of different devices into an IC. In some embodiments further described elsewhere herein, back-side processing may be employed to interconnect a power bus to various device terminals within an IC.

In some embodiments, back-side processing includes bonding to a secondary host substrate. Such bonding may employ any layer transfer process to join the back-side (e.g., non-native) material layer to another substrate. Following such joining, the former host substrate may be removed as a sacrificial donor to re-expose the front-side stack and/or the front side of the device layer. Such embodiments may enable iterative side-to-side lamination of device strata with a first device layer serving as the core of the assembly. In some embodiments illustrated in FIGS. 4G and 5G, secondary host substrate 440 joined to non-native material layer 420 provides at least mechanical support while host substrate 402 is removed.

Any bonding, such as, but not limited to, thermal-compression bonding may be employed to join secondary host substrate 440 to non-native material layer 420. In some embodiments, both a surface layer of secondary host substrate 440 and non-native material layer 420 are continuous dielectric layers (e.g., SiO), which are thermal-compression bonded. In some other embodiments, both a surface layer of secondary host substrate 440 and non-native material layer 420 include a metal layer (e.g., Au, Pt, etc.), which are thermal-compression bonded. In other embodiments, at least one of surface layer of secondary host substrate 440 and non-native material layer 420 are patterned, including both patterned metal surface (i.e., traces) and surrounding dielectric (e.g., isolation), which are thermal-compression bonded to form a hybrid (e.g., metal/oxide) joint. For such embodiments, structural features in the secondary host substrate 440 and the patterned non-native material layer 420 are aligned (e.g., optically) during the bonding process. In some embodiments, non-native material layer 420 includes one or more conductive back-side traces coupled to a terminal of a transistor fabricated in device layer 415. The conductive back-side trace may, for example, be bonded to metallization on secondary host substrate 440.

Bonding of device strata may proceed from the front-side and/or back-side of a device layer before or after front-side processing of the device layer has been completed. A back-side bonding process may be performed after front-side fabrication of a device (e.g., transistor) is substantially complete. Alternatively, back-side bonding process may be performed prior to completing front-side fabrication of a device (e.g., transistor), in which case the front side of the device layer may receive additional processing following the back-side bonding process. As further illustrated in FIGS. 4H and 5H, for example, front-side processing includes removal of host substrate 402 (as a second donor substrate) to re-expose the front side of device layer 415. At this point, donor-host substrate assembly 403 includes secondary host 440 joined to device layer 415 through non-native material layer 420.

In another aspect, one or more embodiments are directed to neighboring semiconductor structures or devices separated by self-aligned gate endcap (SAGE) structures. Particular embodiments may be directed to integration of multiple width (multi-Wsi) nanowires and nanoribbons in a SAGE architecture and separated by a SAGE wall. In an embodiment, nanowires/nanoribbons are integrated with multiple Wsi in a SAGE architecture portion of a front end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed) or formed by vertical merging (e.g., epitaxial regions are formed around existing wires), as described in greater detail below in association with FIGS. 9A-9E.

To provide further context, advantages of a self-aligned gate endcap (SAGE) architecture may include the enabling of higher layout density and, in particular, scaling of diffusion to diffusion spacing. To provide illustrative comparison, FIG. 6 illustrates cross-sectional views taken through nanowires and fins for a non-endcap architecture (left-hand side) versus a self-aligned gate endcap (SAGE) architecture (right-hand side), in accordance with an embodiment of the present disclosure.

Figure 6:
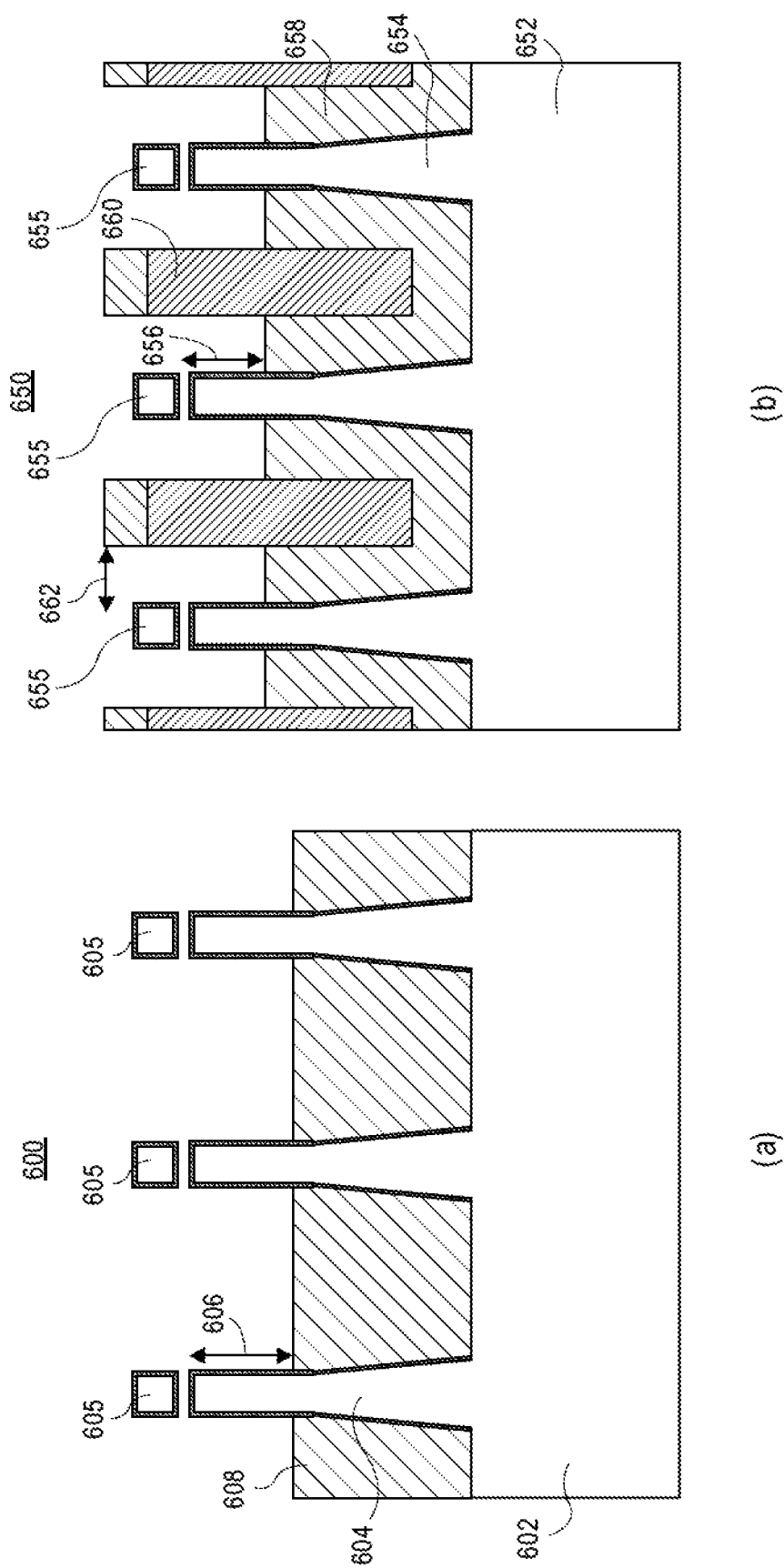
FIG. 6 illustrates cross-sectional views taken (a) through nanowires and fins for a non-endcap architecture (left-hand side) versus (b) a self-aligned gate endcap (SAGE) architecture (right-hand side), in accordance with an embodiment of the present disclosure.

Referring to the left-hand side of FIG. 6, an integrated circuit structure 600 includes a substrate 602 having fins 604 protruding therefrom by an amount 606 above an isolation structure 608 laterally surrounding lower portions of the fins 604. Corresponding nanowires 605 are over the fins 604. A gate structure may be formed over the integrated circuit structure 600 to fabricate a device. However, breaks in such a gate structure may be accommodated for by increasing the spacing between fin 604/nanowire 605 pairs.

By contrast, referring to the right-hand side of FIG. 6, an integrated circuit structure 650 includes a substrate 652 having fins 654 protruding therefrom by an amount 656 above an isolation structure 658 laterally surrounding lower portions of the fins 604. Corresponding nanowires 655 are over the fins 654. Isolating SAGE walls 660 (which may include a hardmask thereon, as depicted) are included within the isolation structure 652 and between adjacent fin 654/nanowire 655 pairs. The distance between an isolating SAGE wall 660 and a nearest fin 654/nanowire 655 pair defines the gate endcap spacing 662. A gate structure may be formed over the integrated circuit structure 600, between insolating SAGE walls to fabricate a device. Breaks in such a gate structure are imposed by the isolating SAGE walls. Since the isolating SAGE walls 660 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 660. In an embodiment, as depicted, the SAGE walls 660 each include a lower dielectric portion and a dielectric cap on the lower dielectric portion.

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of a gate endcap isolation structure, which may also be referred to as a gate wall, an isolation gate wall or a self-aligned gate endcap (SAGE) wall.

Figure 7:
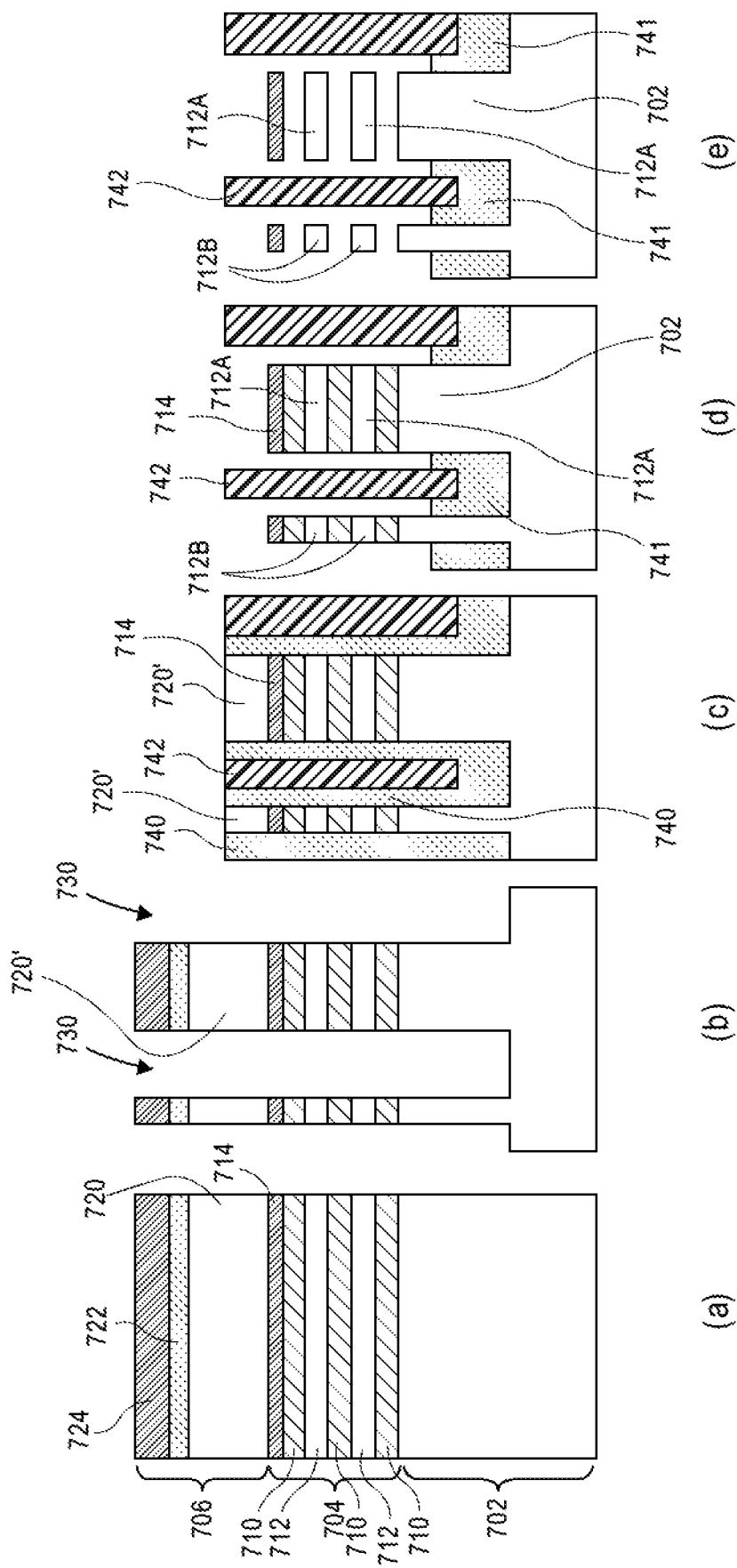
FIG. 7 illustrates cross-sectional views representing various operations in a method of fabricating a self-aligned gate endcap (SAGE) structure with gate-all-around devices, in accordance with an embodiment of the present disclosure.

In an exemplary processing scheme for structures having SAGE walls separating neighboring devices, FIG. 7 illustrate cross-sectional views representing various operations in a method of fabricating a self-aligned gate endcap (SAGE) structure with gate-all-around devices, in accordance with an embodiment of the present disclosure.

Referring to part (a) of FIG. 7, a starting structure includes a nanowire patterning stack 704 above a substrate 702. A lithographic patterning stack 706 is formed above the nanowire patterning stack 704. The nanowire patterning stack 704 includes alternating silicon germanium layers 710 and silicon layers 712. A protective mask 714 is between the nanowire patterning stack 704 and the lithographic patterning stack 706. In one embodiment, the lithographic patterning stack 706 is trilayer mask composed of a topographic masking portion 720, an anti-reflective coating (ARC) layer 722, and a photoresist layer 724. In a particular such embodiment, the topographic masking portion 720 is a carbon hardmask (CHM) layer and the anti-reflective coating layer 722 is a silicon ARC layer.

Referring to part (b) of FIG. 7, the stack of part (a) is lithographically patterned and then etched to provide an etched structure including a patterned substrate 702 and trenches 730.

Referring to part (c) of FIG. 7, the structure of part (b) has an isolation layer 740 and a SAGE material 742 formed in trenches 730. The structure is then planarized to leave patterned topographic masking layer 720' as an exposed upper layer.

Referring to part (d) of FIG. 7, the isolation layer 740 is recessed below an upper surface of the patterned substrate 702, e.g., to define a protruding fin portion and to provide a trench isolation structure 741 beneath SAGE walls 742.

Referring to part (e) of FIG. 7, the silicon germanium layers 710 are removed at least in the channel region to release silicon nanowires 712A and 712B. Subsequent to the formation of the structure of part (e) of FIG. 7, a gate stacks may be formed around nanowires 712B or 712A, over protruding fins of substrate 702, and between SAGE walls 742. In one embodiment, prior to formation of the gate stacks, the remaining portion of protective mask 714 is removed. In another embodiment, the remaining portion of protective mask 714 is retained as an insulating fin hat as an artifact of the processing scheme.

Referring again to part (e) of FIG. 7, it is to be appreciated that a channel view is depicted, with source or drain regions or structures (and corresponding conductive contact structure, which may be partitioned, and which may be one of a pair of differentiated neighboring partitioned source or drain contact structures, as described above in association with FIGS. 1J and 2) being locating into and out of the page. In an embodiment, the channel region including nanowires 712B has a width less than the channel region including nanowires 712A. Thus, in an embodiment, an integrated circuit structure includes multiple width (multi-Wsi) nanowires. Although structures of 712B and 712A may be differentiated as nanowires and nanoribbons, respectively, both such structures are typically referred to herein as nanowires. It is also to be appreciated that reference to or depiction of a fin/nanowire pair throughout may refer to a structure including a fin and one or more overlying nanowires (e.g., two overlying nanowires are shown in FIG. 7).

To highlight an exemplary integrated circuit structure having three vertically arranged nanowires, FIG. 8A illustrates a three-dimensional cross-sectional view of a nanowire-based integrated circuit structure, in accordance with an embodiment of the present disclosure. FIG. 8B illustrates a cross-sectional source or drain view of the nanowire-based integrated circuit structure of FIG. 8A, as taken along the a-a' axis. FIG. 8C illustrates a cross-sectional channel view of the nanowire-based integrated circuit structure of FIG. 8A, as taken along the b-b' axis.

Referring to FIG. 8A, an integrated circuit structure 800 includes one or more vertically stacked nanowires (804 set) above a substrate 802. An optional fin between the bottommost nanowire and the substrate 802 is not depicted for the sake of emphasizing the nanowire portion for illustrative purposes. Embodiments herein are targeted at both single wire devices and multiple wire devices. As an example, a three nanowire-based devices having nanowires 804A, 804B and 804C is shown for illustrative purposes. For convenience of description, nanowire 804A is used as an example where description is focused on one of the nanowires. It is to be appreciated that where attributes of one nanowire are described, embodiments based on a plurality of nanowires may have the same or essentially the same attributes for each of the nanowires.

Each of the nanowires 804 includes a channel region 806 in the nanowire. The channel region 806 has a length (L). Referring to FIG. 8C, the channel region also has a perimeter (Pc) orthogonal to the length (L). Referring to both FIGS. 8A and 8C, a gate electrode stack 808 surrounds the entire perimeter (Pc) of each of the channel regions 806. The gate electrode stack 808 includes a gate electrode along with a gate dielectric layer between the channel region 806 and the gate electrode (not shown). In an embodiment, the channel region is discrete in that it is completely surrounded by the gate electrode stack 808 without any intervening material such as underlying substrate material or overlying channel fabrication materials. Accordingly, in embodiments having a plurality of nanowires 804, the channel regions 806 of the nanowires are also discrete relative to one another.

Referring to both FIGS. 8A and 8B, integrated circuit structure 800 includes a pair of non-discrete source or drain regions 810/812. The pair of non-discrete source or drain regions 810/812 is on either side of the channel regions 806 of the plurality of vertically stacked nanowires 804. Furthermore, the pair of non-discrete source or drain regions 810/812 is adjoining for the channel regions 806 of the plurality of vertically stacked nanowires 804. In one such embodiment, not depicted, the pair of non-discrete source or drain regions 810/812 is directly vertically adjoining for the channel regions 806 in that epitaxial growth is on and between nanowire portions extending beyond the channel regions 806, where nanowire ends are shown within the source or drain structures. In another embodiment, as depicted in FIG. 8A, the pair of non-discrete source or drain regions 810/812 is indirectly vertically adjoining for the channel regions 806 in that they are formed at the ends of the nanowires and not between the nanowires.

In an embodiment, as depicted, the source or drain regions 810/812 are non-discrete in that there are not individual and discrete source or drain regions for each channel region 806 of a nanowire 804. Accordingly, in embodiments having a plurality of nanowires 804, the source or drain regions 810/812 of the nanowires are global or unified source or drain regions as opposed to discrete for each nanowire. In one embodiment, from a cross-sectional perspective orthogonal to the length of the discrete channel regions 806, each of the pair of non-discrete source or drain regions 810/812 is approximately rectangular in shape with a bottom tapered portion and a top vertex portion, as depicted in FIG. 8B. In other embodiments, however, the source or drain regions 810/812 of the nanowires are relatively larger yet discrete non-vertically merged epitaxial structures such as nubs described in association with FIGS. 1B and 2.

In accordance with an embodiment of the present disclosure, and as depicted in FIGS. 8A and 8B, integrated circuit structure 800 further includes a pair of contacts 814, each contact 814 on one of the pair of non-discrete source or drain regions 810/812. In one such embodiment, in a vertical sense, each contact 814 completely surrounds the respective non-discrete source or drain regions 810/812. In another aspect, the entire perimeter of the non-discrete source or drain regions 810/812 may not be accessible for contact with contacts 814, and the contact 814 thus only partially surrounds the non-discrete source or drain regions 810/812, as depicted in FIG. 8B. In a contrasting embodiment, not depicted, the entire perimeter of the non-discrete source or drain regions 810/812, as taken along the a-a' axis, is surrounded by the contacts 814. In accordance with an embodiment of the present disclosure, although not depicted, one or both of the pair of contacts 814 is a partitioned contact structure, which may be one of a pair of differentiated neighboring partitioned source or drain contact structures, as described above in association with FIGS. 1J and 2.

Referring to FIGS. 8B and 8C, the non-discrete source or drain regions 810/812 are global in the sense that a single unified feature is used as a source or drain region for a plurality (in this case, 3) of nanowires 804 and, more particularly, for more than one discrete channel region 806. In an embodiment, the pair of non-discrete source or drain regions 810/812 is composed of a semiconductor material different than the semiconductor material of the discrete channel regions 806, e.g., the pair of non-discrete source or drain regions 810/812 is composed of a silicon germanium while the discrete channel regions 806 are composed of silicon. In another embodiment, the pair of non-discrete source or drain regions 810/812 is composed of a semiconductor material the same or essentially the same as the semiconductor material of the discrete channel regions 806, e.g., both the pair of non-discrete source or drain regions 810/812 and the discrete channel regions 806 are composed of silicon.

Referring again to FIG. 8A, in an embodiment, integrated circuit structure 800 further includes a pair of spacers 816. As is depicted, outer portions of the pair of spacers 816 may overlap portions of the non-discrete source or drain regions 810/812, providing for "embedded" portions of the non-discrete source or drain regions 810/812 beneath the pair of spacers 816. As is also depicted, the embedded portions of the non-discrete source or drain regions 810/812 may not extend beneath the entirety of the pair of spacers 816.

Substrate 802 may be composed of a material suitable for integrated circuit structure fabrication. In one embodiment, substrate 802 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxynitride is on the lower bulk substrate. Thus, the structure 800 may be fabricated from a starting semiconductor-on-insulator substrate. Alternatively, the structure 800 is formed directly from a bulk substrate and local oxidation is used to form electrically insulative portions in place of the above described upper insulator layer. In another alternative embodiment, the structure 800 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 804 may be sized as wires or ribbons, as described below, and may have squared-off or rounder corners. In an embodiment, the nanowires 804 are composed of a material such as, but not limited to, silicon, germanium, or a combination thereof. In one such embodiment, the nanowires are single-crystalline. For example, for a silicon nanowire 804, a single-crystalline nanowire may be based from a (100) global orientation, e.g., with a <100> plane in the z-direction. As described below, other orientations may also be considered. In an embodiment, the dimensions of the nanowires 804, from a cross-sectional perspective, are on the nano-scale. For example, in a specific embodiment, the smallest dimension of the nanowires 804 is less than approximately 20 nanometers. In an embodiment, the nanowires 804 are composed of a strained material, particularly in the channel regions 806.

Referring to FIG. 8C, in an embodiment, each of the channel regions 806 has a width (Wc) and a height (Hc), the width (Wc) approximately the same as the height (Hc). That is, in both cases, the channel regions 806 are square-like or, if corner-rounded, circle-like in cross-section profile. In another aspect, the width and height of the channel region need not be the same, such as the case for nanoribbbons as described throughout.

In another aspect, methods of fabricating a nanowire portion of a fin/nanowire integrated circuit structure are provided. For example, FIGS. 9A-9E illustrate three-dimensional cross-sectional views representing various operations in a method of fabricating a nanowire portion of a fin/nanowire structure, in accordance with an embodiment of the present disclosure.

Figure 9A:
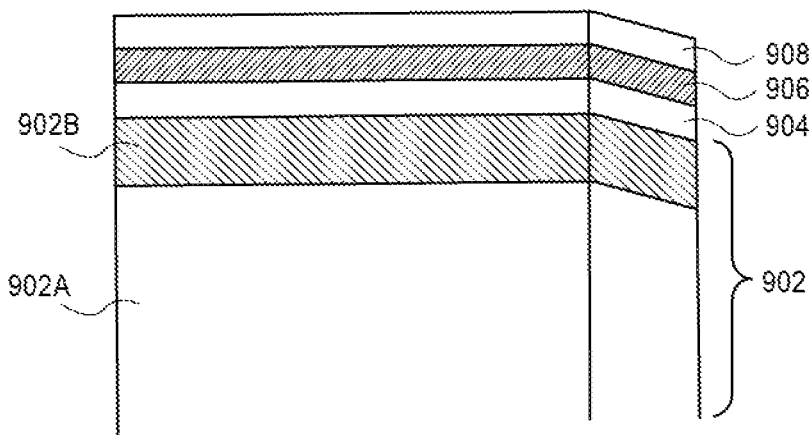
FIGS. 9A-9E illustrate three-dimensional cross-sectional views representing various operations in a method of fabricating a nanowire portion of a fin/nanowire structure, in accordance with an embodiment of the present disclosure.

A method of fabricating a nanowire integrated circuit structure may include forming a nanowire above a substrate. In a specific example showing the formation of two silicon nanowires, FIG. 9A illustrates a substrate 902 (e.g., composed of a bulk substrate silicon substrate 902A with an insulating silicon dioxide layer 902B there on) having a silicon layer 904/silicon germanium layer 906/silicon layer 908 stack thereon. It is to be understood that, in another embodiment, a silicon germanium layer/silicon layer/silicon germanium layer stack may be used to ultimately form two silicon germanium nanowires.

Figure 9B:
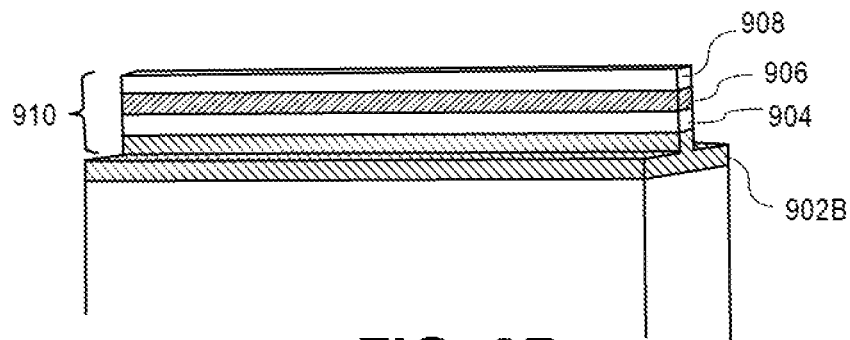

Referring to FIG. 9B, a portion of the silicon layer 904/silicon germanium layer 906/silicon layer 908 stack as well as a top portion of the silicon dioxide layer 902B is patterned into a fin-type structure 910, e.g., with a mask and plasma etch process. It is to be appreciated that, for illustrative purposes, the etch for FIG. 9B is shown as forming two silicon nanowire precursor portions. Although the etch is shown for ease of illustration as ending within a bottom isolation layer, more complex stacks are contemplated within the context of embodiments of the present disclosure. For example, the process may be applied to a nanowire/fin stack as described in association with FIG. 7.

Figure 9C:
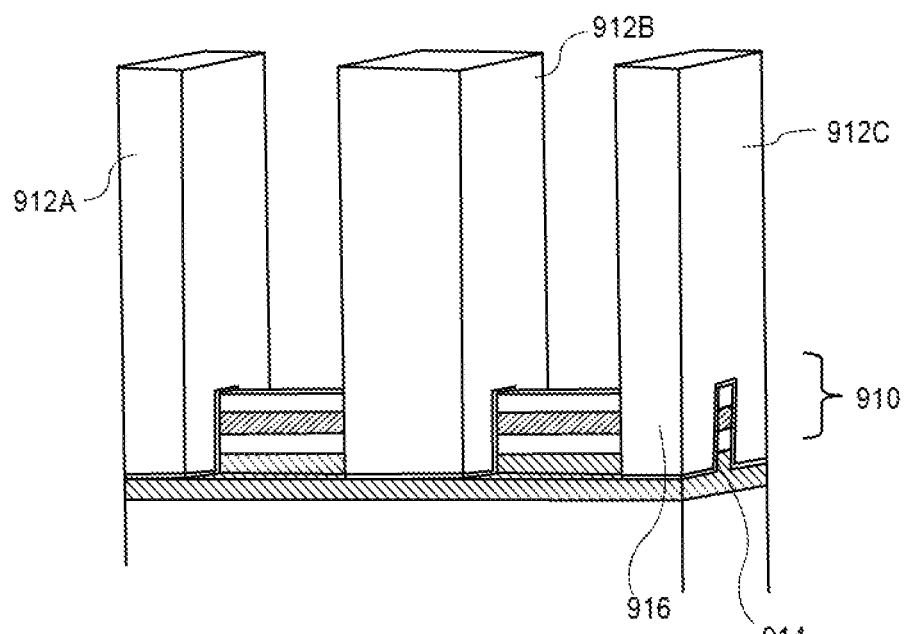

The method may also include forming a channel region in the nanowire, the channel region having a length and a perimeter orthogonal to the length. In a specific example showing the formation of three gate structures over the two silicon nanowires, FIG. 9C illustrates the fin-type structure 910 with three sacrificial gates 912A, 912B, and 912C thereon. In one such embodiment, the three sacrificial gates 912A, 912B, and 912C are composed of a sacrificial gate oxide layer 914 and a sacrificial polysilicon gate layer 916 which are blanket deposited and patterned with a plasma etch process.

Figure 9D:
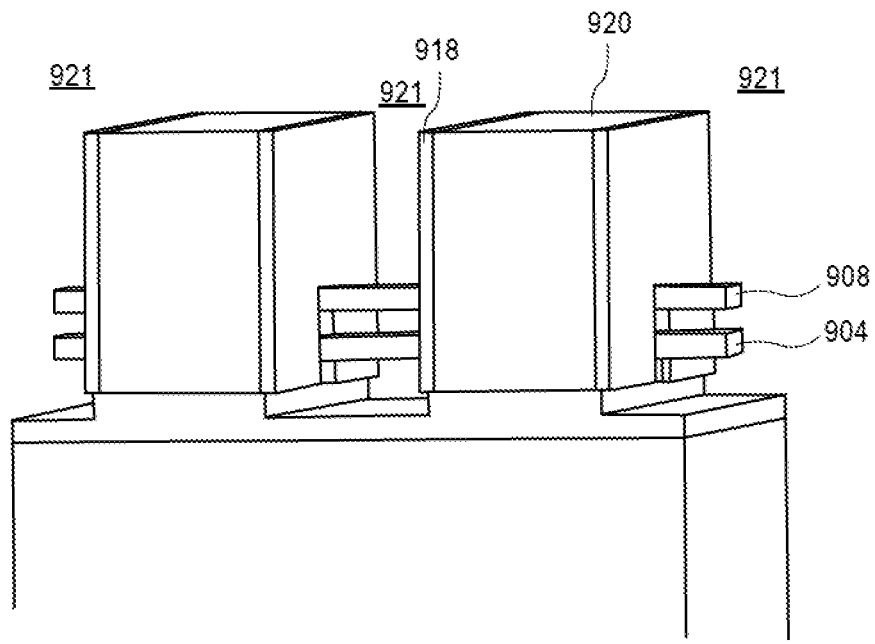

Following patterning to form the three sacrificial gates 912A, 912B, and 912C, spacers may be formed on the sidewalls of the three sacrificial gates 912A, 912B, and 912C, doping may be performed (e.g., tip and/or source and drain type doping), and an interlayer dielectric layer may be formed to cover the three sacrificial gates 912A, 912B, and 912C. The interlayer dielectric layer may be polished to expose the three sacrificial gates 912A, 912B, and 912C for a replacement gate, or gate-last, process. Referring to FIG. 9D, the three sacrificial gates 912A, 912B, and 912C have been removed, leaving spacers 918 and a portion of the interlayer dielectric layer 920 remaining.

Additionally, referring again to FIG. 9D the portions of the silicon germanium layer 906 and the portion of the insulating silicon dioxide layer 902B of the fin structure 910 are removed in the regions originally covered by the three sacrificial gates 912A, 912B, and 912C. Discrete portions of the silicon layers 904 and 908 thus remain, as depicted in FIG. 9D.

The discrete portions of the silicon layers 904 and 908 shown in FIG. 9D will, in one embodiment, ultimately become channel regions in a nanowire-based device. Thus, at the process stage depicted in FIG. 9D, channel engineering or tuning may be performed. For example, in one embodiment, the discrete portions of the silicon layers 904 and 908 shown in FIG. 9D are thinned using oxidation and etch processes. Such an etch process may be performed at the same time the wires are separated by etching the silicon germanium layer 906. Accordingly, the initial wires formed from silicon layers 904 and 908 begin thicker and are thinned to a size suitable for a channel region in a nanowire device, independent from the sizing of the source and drain regions of the device. Thus, in an embodiment, forming the channel region includes removing a portion of the nanowire, and the resulting perimeters of the source and drain regions (described below) are greater than the perimeter of the resulting channel region.

Figure 9E:
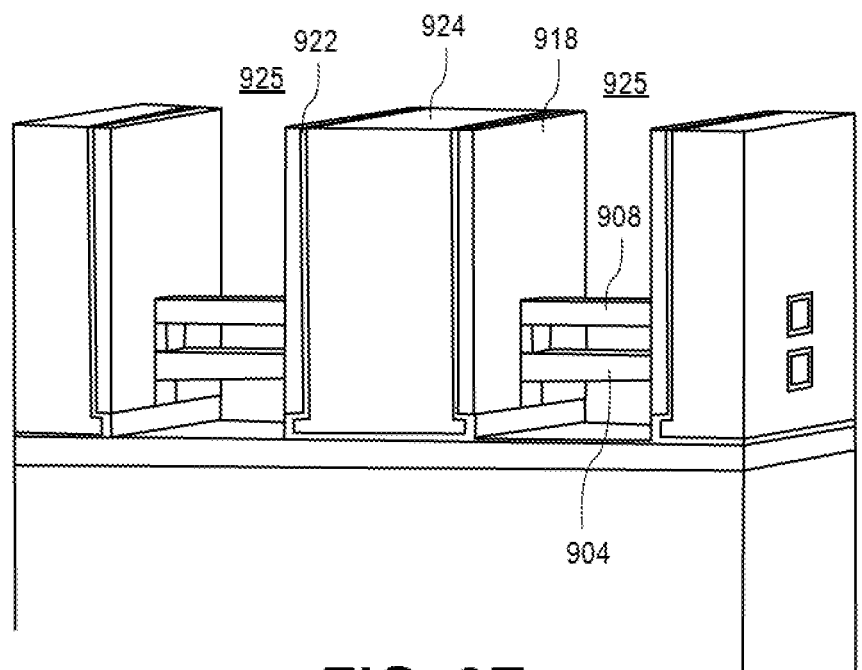

The method may also include forming a gate electrode stack surrounding the entire perimeter of the channel region. In the specific example showing the formation of three gate structures over the two silicon nanowires, FIG. 9E illustrates the structure following deposition of a gate dielectric layer 922 (such as a high-k gate dielectric layer) and a gate electrode layer 924 (such as a metal gate electrode layer), and subsequent polishing, in between the spacers 918. That is, gate structures are formed in the trenches 921 of FIG. 9D. Additionally, FIG. 9E depicts the result of the subsequent removal of the interlayer dielectric layer 920 after formation of the permanent gate stack. The portions of the silicon germanium layer 906 and the portion of the insulating silicon dioxide layer 902B of the fin structure 910 are also removed in the regions originally covered by the portion of the interlayer dielectric layer 920 depicted in FIG. 9D. Discrete portions of the silicon layers 904 and 908 thus remain, as depicted in FIG. 9E.

The method may also include forming a pair of source and drain regions in the nanowire, on either side of the channel region, each of the source and drain regions having a perimeter orthogonal to the length of the channel region. Specifically, the discrete portions of the silicon layers 904 and 908 shown in FIG. 9E will, in one embodiment, ultimately become at least a portion of the source and drain regions in a nanowire-based device. In one such embodiment, epitaxial source or drain structures are formed by merging epitaxial material around existing nanowires 904 and 908. In another embodiment, epitaxial source or drain structures are embedded, e.g., portions of nanowires 904 and 908 are removed and then source or drain (S/D) growth is performed. In the latter case, in accordance with an embodiment of the present disclosure, such epitaxial source or drain structures may be non-discrete, as exemplified in association with FIGS. 8A and 8B, or may be discrete, as exemplified in association with FIGS. 1B and 2.

The method may subsequently include forming a pair of contacts, a first of the pair of contacts completely or nearly completely surrounding the perimeter of the source region, and a second of the pair of contacts completely or nearly completely surrounding the perimeter of the drain region. In an embodiment, one or both of the pair of contacts is a partitioned source or drain contact structure, which may be one of a pair of differentiated neighboring partitioned source or drain contact structures, as described above in association with FIGS. 1J and 2. Specifically, contacts are formed in the trenches 925 of FIG. 9E following epitaxial growth. One of the trenches may first be recessed further than the other of the trenches. In an embodiment, the contacts are formed from a metallic species. In one such embodiment, the metallic species is formed by conformally depositing a contact metal and then filling any remaining trench volume. The conformal aspect of the deposition may be performed by using chemical vapor deposition (CVD), atomic layer deposition (ALD), or metal reflow.

In an embodiment, as described throughout, an integrated circuit structure includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

In an embodiment, as described throughout, a substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

In an embodiment, as described throughout, a trench isolation layer may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, a trench isolation layer is composed of a dielectric material such as, but not limited to, silicon dioxide, silicon oxy-nitride, silicon nitride, or carbon-doped silicon nitride.

In an embodiment, as described throughout, self-aligned gate endcap isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
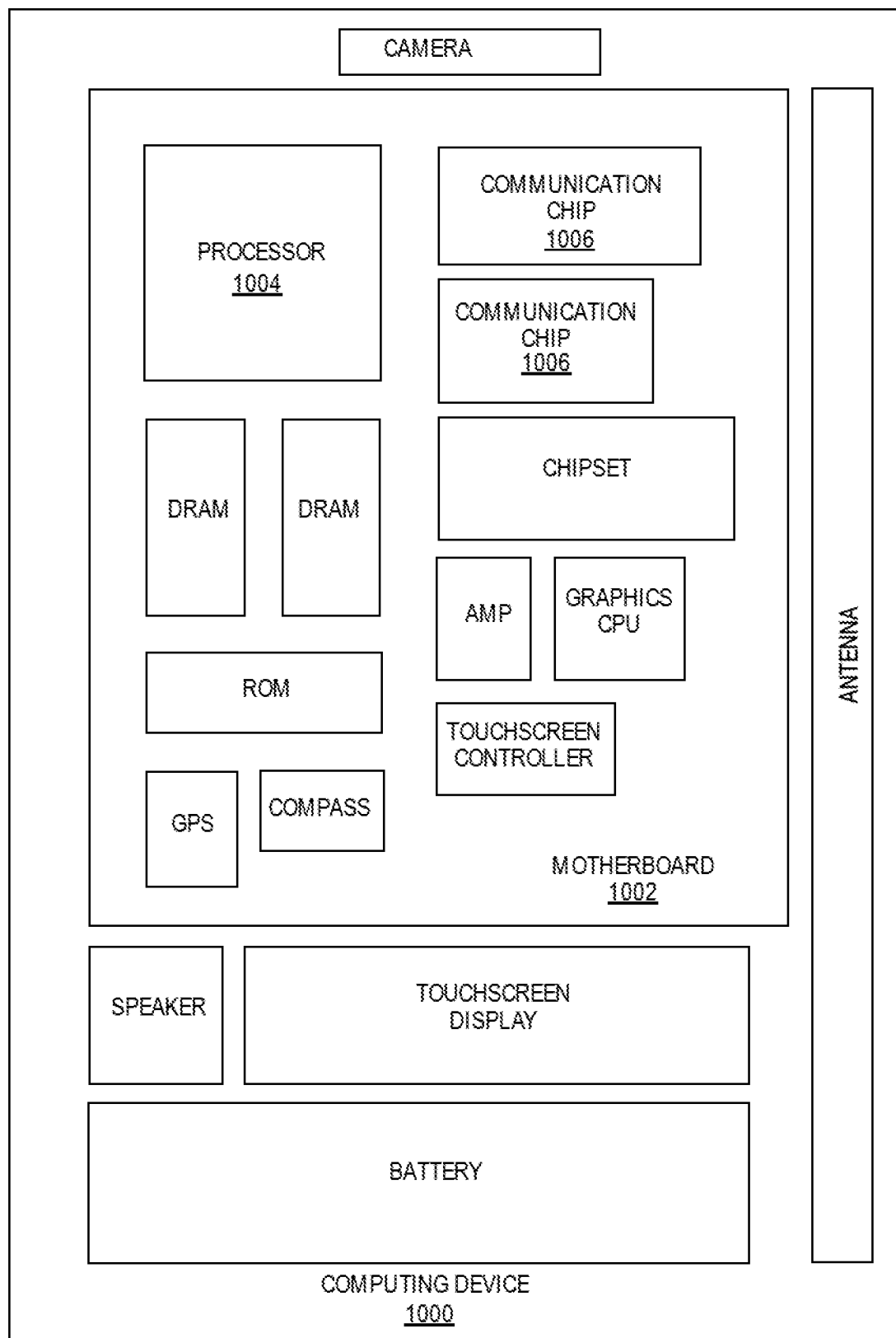
FIG. 10 illustrates a computing device in accordance with one implementation of an embodiment of the disclosure.

FIG. 10 illustrates a computing device 1000 in accordance with one implementation of an embodiment of the present disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. The integrated circuit die of the processor 1004 may include one or more structures, such as integrated circuit structures having partitioned source or drain contact structures, which may be one of a pair of differentiated neighboring partitioned source or drain contact structures, built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. The integrated circuit die of the communication chip 1006 may include one or more structures, such as integrated circuit structures having partitioned source or drain contact structures, which may be one of a pair of differentiated neighboring partitioned source or drain contact structures, built in accordance with implementations of embodiments of the present disclosure.

In further implementations, another component housed within the computing device 1000 may contain an integrated circuit die that includes one or structures, such as integrated circuit structures having partitioned source or drain contact structures, which may be one of a pair of differentiated neighboring partitioned source or drain contact structures, built in accordance with implementations of embodiments of the present disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
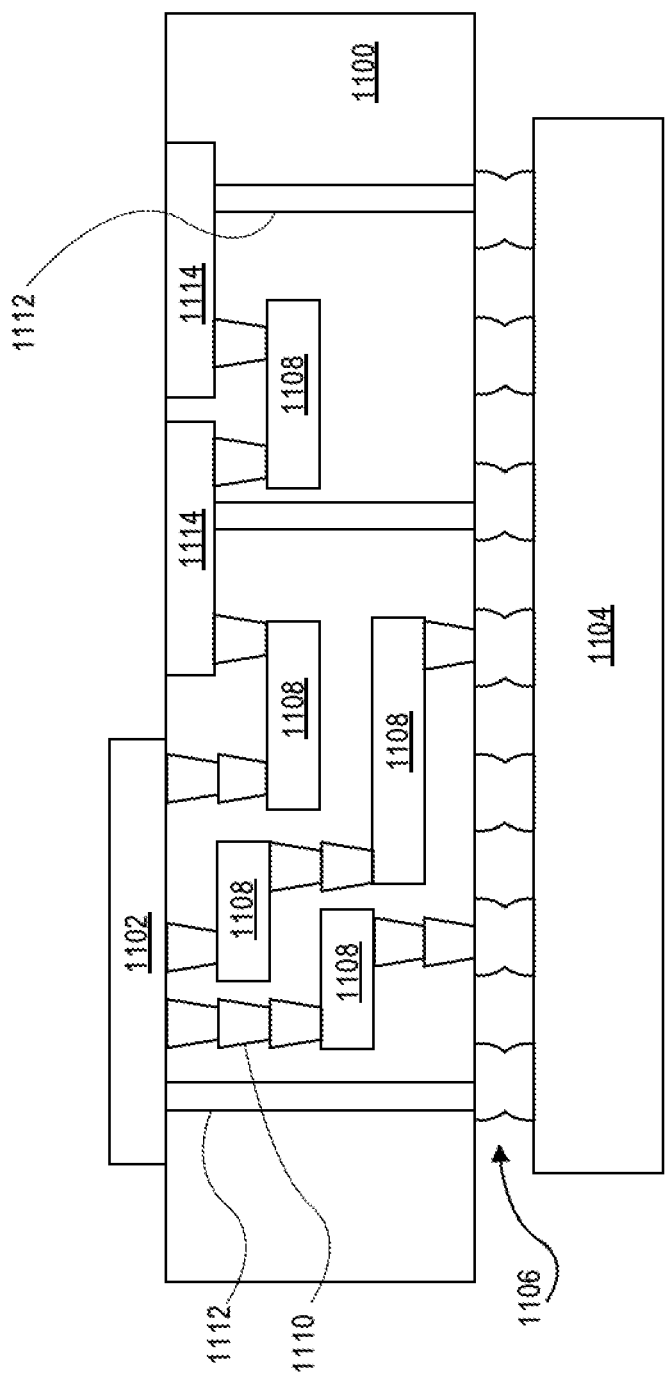
FIG. 11 illustrates an interposer that includes one or more embodiments of the disclosure.

FIG. 11 illustrates an interposer 1100 that includes one or more embodiments of the present disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100 or in the fabrication of components included in the interposer 1100.

Thus, embodiments of the present disclosure include neighboring gate-all-around integrated circuit structures having disjoined epitaxial source or drain regions, and methods of fabricating neighboring gate-all-around integrated circuit structures having disjoined epitaxial source or drain regions.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a first fin and a second fin. A first gate stack is over the first fin, and a second gate stack is over the second fin. A first epitaxial source or drain structure is at a first end of the first fin, and a second epitaxial source or drain structure is at a second end of the first fin. A third epitaxial source or drain structure is at a first end of the second fin, and a fourth epitaxial source or drain structure is at a second end of the second fin. A first conductive contact structure is coupled to one of the first or the second epitaxial source or drain structures, the first conductive contact structure having a first portion partitioned from a second portion. A second conductive contact structure is coupled to one of the third or the fourth epitaxial source or drain structures, the second conductive contact structure having a first portion partitioned from a second portion, and the second conductive contact structure neighboring the first conductive contact structure and having a composition different than a composition of the first conductive contact structure.

Example embodiment 2: The integrated circuit structure of example embodiment 1, wherein the first portion of the first conductive contact structure is on a first surface of the one of the first or the second epitaxial source or drain structures, and the second portion of the first conductive contact structure is on a second surface of the one of the first or the second epitaxial source or drain structures, the second surface opposite the first surface, and wherein the first portion of the second conductive contact structure is on a first surface of the one of the third or the fourth epitaxial source or drain structures, and the second portion of the second conductive contact structure is on a second surface of the one of the third or the fourth epitaxial source or drain structures, the second surface opposite the first surface.

Example embodiment 3: The integrated circuit structure of example embodiment 1 or 2, wherein the first portion of the first conductive contact structure is in contact with the second portion of the first conductive contact structure, and wherein the first portion of the second conductive contact structure is in contact with the second portion of the second conductive contact structure.

Example embodiment 4: The integrated circuit structure of example embodiment 1 or 2, wherein the first portion of the first conductive contact structure is isolated from the second portion of the first conductive contact structure, and wherein the first portion of the second conductive contact structure is isolated from the second portion of the second conductive contact structure.

Example embodiment 5: The integrated circuit structure of example embodiment 1, 2, 3 or 4, further including a first backside interconnect on the second portion of the first conductive contact structure, and a second backside interconnect on the second portion of the second conductive contact structure.

Example embodiment 6: The integrated circuit structure of example embodiment 1, 2, 3, 4 or 5, wherein the second portions of the first and second conductive contact structures have a bottom surface co-planar with a bottom surface of the first and second fins.

Example embodiment 7: The integrated circuit structure of example embodiment 1, 2, 3, 4, 5 or 6, wherein the first and second fins are first and second silicon fins.

Example embodiment 8: The integrated circuit structure of example embodiment 1, 2, 3, 4, 5, 6 or 7, wherein the first and second gate stacks each include a high-k gate dielectric layer and a metal gate electrode.

Example embodiment 9: An integrated circuit structure includes a first nanowire and a second nanowire. A first gate stack is around the first nanowire, and a second gate stack is around the second nanowire. A first epitaxial source or drain structure is at a first end of the first nanowire, and a second epitaxial source or drain structure is at a second end of the first nanowire. A third epitaxial source or drain structure is at a first end of the second nanowire, and a fourth epitaxial source or drain structure is at a second end of the second nanowire. A first conductive contact structure is coupled to one of the first or the second epitaxial source or drain structures, the first conductive contact structure having a first portion partitioned from a second portion. A second conductive contact structure is coupled to one of the third or the fourth epitaxial source or drain structures, the second conductive contact structure having a first portion partitioned from a second portion, and the second conductive contact structure neighboring the first conductive contact structure and having a composition different than a composition of the first conductive contact structure.

Example embodiment 10: The integrated circuit structure of example embodiment 9, wherein the first portion of the first conductive contact structure is on a first surface of the one of the first or the second epitaxial source or drain structures, and the second portion of the first conductive contact structure is on a second surface of the one of the first or the second epitaxial source or drain structures, the second surface opposite the first surface, and wherein the first portion of the second conductive contact structure is on a first surface of the one of the third or the fourth epitaxial source or drain structures, and the second portion of the second conductive contact structure is on a second surface of the one of the third or the fourth epitaxial source or drain structures, the second surface opposite the first surface.

Example embodiment 11: The integrated circuit structure of example embodiment 9 or 10, wherein the first portion of the first conductive contact structure is in contact with the second portion of the first conductive contact structure, and wherein the first portion of the second conductive contact structure is in contact with the second portion of the second conductive contact structure.

Example embodiment 12: The integrated circuit structure of example embodiment 9 or 10, wherein the first portion of the first conductive contact structure is isolated from the second portion of the first conductive contact structure, and wherein the first portion of the second conductive contact structure is isolated from the second portion of the second conductive contact structure.

Example embodiment 13: The integrated circuit structure of example embodiment 9, 10, 11 or 12, further including a first backside interconnect on the second portion of the first conductive contact structure, and a second backside interconnect on the second portion of the second conductive contact structure.

Example embodiment 14: The integrated circuit structure of example embodiment 9, 10, 11, 12 or 13, wherein the first nanowire is a first silicon nanowire, and wherein the second nanowire is a second silicon nanowire.

Example embodiment 15: The integrated circuit structure of example embodiment 9, 10, 11, 12, 13 or 14, wherein the first and second gate stacks each include a high-k gate dielectric layer and a metal gate electrode.

Example embodiment 16: An integrated circuit structure includes a first vertical arrangement of nanowires above a first fin, and a second vertical arrangement of nanowires above a second fin. A first gate stack is around the first vertical arrangement of nanowires, and a second gate stack is around the second vertical arrangement of nanowires. A first epitaxial source or drain structure is at a first end of the first vertical arrangement of nanowires, and a second epitaxial source or drain structure is at a second end of the first vertical arrangement of nanowires. A third epitaxial source or drain structure is at a first end of the second vertical arrangement of nanowires, and a fourth epitaxial source or drain structure is at a second end of the second vertical arrangement of nanowires. A first conductive contact structure is coupled to one of the first or the second epitaxial source or drain structures, the first conductive contact structure having a first portion partitioned from a second portion. The conductive contact structure has a first portion partitioned from a second portion. A second conductive contact structure is coupled to one of the third or the fourth epitaxial source or drain structures, the second conductive contact structure having a first portion partitioned from a second portion, and the second conductive contact structure neighboring the first conductive contact structure and having a composition different than a composition of the first conductive contact structure.

Example embodiment 17: The integrated circuit structure of example embodiment 16, wherein the first portion of the first conductive contact structure is on a first surface of the one of the first or the second epitaxial source or drain structures, and the second portion of the first conductive contact structure is on a second surface of the one of the first or the second epitaxial source or drain structures, the second surface opposite the first surface, and wherein the first portion of the second conductive contact structure is on a first surface of the one of the third or the fourth epitaxial source or drain structures, and the second portion of the second conductive contact structure is on a second surface of the one of the third or the fourth epitaxial source or drain structures, the second surface opposite the first surface.

Example embodiment 18: The integrated circuit structure of example embodiment 16 or 17, wherein the first portion of the first conductive contact structure is in contact with the second portion of the first conductive contact structure, and wherein the first portion of the second conductive contact structure is in contact with the second portion of the second conductive contact structure.

Example embodiment 19: The integrated circuit structure of example embodiment 16 or 17, wherein the first portion of the first conductive contact structure is isolated from the second portion of the first conductive contact structure, and wherein the first portion of the second conductive contact structure is isolated from the second portion of the second conductive contact structure.

Example embodiment 20: The integrated circuit structure of example embodiment 16, 17, 18 or 19, further including a first backside interconnect on the second portion of the first conductive contact structure, and a second backside interconnect on the second portion of the second conductive contact structure.

Example embodiment 21: The integrated circuit structure of example embodiment 16, 17, 18, 19 or 20, wherein the second portions of the first and second conductive contact structures have a bottom surface co-planar with a bottom surface of the first and second fins.

Example embodiment 22: The integrated circuit structure of example embodiment 16, 17, 18, 19, 20 or 21, wherein the first vertical arrangement of nanowires is a first vertical arrangement of silicon nanowires, and the first fin is a first silicon fin, and wherein the second vertical arrangement of nanowires is a second vertical arrangement of silicon nanowires, and the second fin is a second silicon fin.

Example embodiment 23: The integrated circuit structure of example embodiment 16, 17, 18, 19, 20, 21 or 22, wherein the first and second gate stacks each include a high-k gate dielectric layer and a metal gate electrode.

Example embodiment 24: The integrated circuit structure of example embodiment 16, 17, 18, 19, 20, 21, 22 or 23, wherein the first and second epitaxial source or drain structures are non-discrete first and second epitaxial source or drain structures, and wherein the third and fourth epitaxial source or drain structures are non-discrete third and fourth epitaxial source or drain structures.

Example embodiment 25: The integrated circuit structure of example embodiment 16, 17, 18, 19, 20, 21, 22 or 23, wherein the first and second epitaxial source or drain structures are discrete first and second epitaxial source or drain structures, and wherein the third and fourth epitaxial source or drain structures are discrete third and fourth epitaxial source or drain structures.

What is claimed is:

1. An integrated circuit structure, comprising:
a first fin and a second fin;
a first gate stack over the first fin, and a second gate stack over the second fin;
a first epitaxial source or drain structure at a first end of the first fin, and a second epitaxial source or drain structure at a second end of the first fin;
a third epitaxial source or drain structure at a first end of the second fin, and a fourth epitaxial source or drain structure at a second end of the second fin;
a first conductive contact structure coupled to one of the first or the second epitaxial source or drain structures, the first conductive contact structure having a first portion partitioned from a second portion; and
a second conductive contact structure coupled to one of the third or the fourth epitaxial source or drain structures, the second conductive contact structure having a first portion partitioned from a second portion, and the second conductive contact structure neighboring the first conductive contact structure and having a composition different than a composition of the first conductive contact structure, wherein the second portions of the first and second conductive contact structures have a bottom surface co-planar with a bottom surface of the first and second fins.

2. The integrated circuit structure of claim 1, wherein the first portion of the first conductive contact structure is on a first surface of the one of the first or the second epitaxial source or drain structures, and the second portion of the first conductive contact structure is on a second surface of the one of the first or the second epitaxial source or drain structures, the second surface opposite the first surface, and wherein the first portion of the second conductive contact structure is on a first surface of the one of the third or the fourth epitaxial source or drain structures, and the second portion of the second conductive contact structure is on a second surface of the one of the third or the fourth epitaxial source or drain structures, the second surface opposite the first surface.

3. The integrated circuit structure of claim 1, wherein the first portion of the first conductive contact structure is in contact with the second portion of the first conductive contact structure, and wherein the first portion of the second conductive contact structure is in contact with the second portion of the second conductive contact structure.

4. The integrated circuit structure of claim 1, wherein the first portion of the first conductive contact structure is isolated from the second portion of the first conductive contact structure, and wherein the first portion of the second conductive contact structure is isolated from the second portion of the second conductive contact structure.

5. The integrated circuit structure of claim 1, further comprising a first backside interconnect on the second portion of the first conductive contact structure, and a second backside interconnect on the second portion of the second conductive contact structure.

6. The integrated circuit structure of claim 1, wherein the first and second fins are first and second silicon fins.

7. The integrated circuit structure of claim 1, wherein the first and second gate stacks each comprise a high-k gate dielectric layer and a metal gate electrode.

8. An integrated circuit structure, comprising:
a first nanowire and a second nanowire;
a first gate stack around the first nanowire, and a second gate stack around the second nanowire;
a first epitaxial source or drain structure at a first end of the first nanowire, and a second epitaxial source or drain structure at a second end of the first nanowire;
a third epitaxial source or drain structure at a first end of the second nanowire, and a fourth epitaxial source or drain structure at a second end of the second nanowire;
a first conductive contact structure coupled to one of the first or the second epitaxial source or drain structures, the first conductive contact structure having a first portion partitioned from a second portion;
a second conductive contact structure coupled to one of the third or the fourth epitaxial source or drain structures, the second conductive contact structure having a first portion partitioned from a second portion, and the second conductive contact structure neighboring the first conductive contact structure and having a composition different than a composition of the first conductive contact structure; and a first backside interconnect on the second portion of the first conductive contact structure, and a second backside interconnect on the second portion of the second conductive contact structure.

9. The integrated circuit structure of claim 8, wherein the first portion of the first conductive contact structure is on a first surface of the one of the first or the second epitaxial source or drain structures, and the second portion of the first conductive contact structure is on a second surface of the one of the first or the second epitaxial source or drain structures, the second surface opposite the first surface, and wherein the first portion of the second conductive contact structure is on a first surface of the one of the third or the fourth epitaxial source or drain structures, and the second portion of the second conductive contact structure is on a second surface of the one of the third or the fourth epitaxial source or drain structures, the second surface opposite the first surface.

10. The integrated circuit structure of claim 8, wherein the first portion of the first conductive contact structure is in contact with the second portion of the first conductive contact structure, and wherein the first portion of the second conductive contact structure is in contact with the second portion of the second conductive contact structure.

11. The integrated circuit structure of claim 8, wherein the first portion of the first conductive contact structure is isolated from the second portion of the first conductive contact structure, and wherein the first portion of the second conductive contact structure is isolated from the second portion of the second conductive contact structure.

12. The integrated circuit structure of claim 8, wherein the first nanowire is a first silicon nanowire, and wherein the second nanowire is a second silicon nanowire.

13. The integrated circuit structure of claim 8, wherein the first and second gate stacks each comprise a high-k gate dielectric layer and a metal gate electrode.

14. An integrated circuit structure, comprising:
a first vertical arrangement of nanowires above a first fin, and a second vertical arrangement of nanowires above a second fin;
a first gate stack around the first vertical arrangement of nanowires, and a second gate stack around the second vertical arrangement of nanowires;
a first epitaxial source or drain structure at a first end of the first vertical arrangement of nanowires, and a second epitaxial source or drain structure at a second end of the first vertical arrangement of nanowires;
a third epitaxial source or drain structure at a first end of the second vertical arrangement of nanowires, and a fourth epitaxial source or drain structure at a second end of the second vertical arrangement of nanowires;
a first conductive contact structure coupled to one of the first or the second epitaxial source or drain structures, the first conductive contact structure having a first portion partitioned from a second portion; and
a second conductive contact structure coupled to one of the third or the fourth epitaxial source or drain structures, the second conductive contact structure having a first portion partitioned from a second portion, and the second conductive contact structure neighboring the first conductive contact structure and having a composition different than a composition of the first conductive contact structure.

15. The integrated circuit structure of claim 14, wherein the first portion of the first conductive contact structure is on a first surface of the one of the first or the second epitaxial source or drain structures, and the second portion of the first conductive contact structure is on a second surface of the one of the first or the second epitaxial source or drain structures, the second surface opposite the first surface, and wherein the first portion of the second conductive contact structure is on a first surface of the one of the third or the fourth epitaxial source or drain structures, and the second portion of the second conductive contact structure is on a second surface of the one of the third or the fourth epitaxial source or drain structures, the second surface opposite the first surface.

16. The integrated circuit structure of claim 14, wherein the first portion of the first conductive contact structure is in contact with the second portion of the first conductive contact structure, and wherein the first portion of the second conductive contact structure is in contact with the second portion of the second conductive contact structure.

17. The integrated circuit structure of claim 14, wherein the first portion of the first conductive contact structure is isolated from the second portion of the first conductive contact structure, and wherein the first portion of the second conductive contact structure is isolated from the second portion of the second conductive contact structure.

18. The integrated circuit structure of claim 14, further comprising a first backside interconnect on the second portion of the first conductive contact structure, and a second backside interconnect on the second portion of the second conductive contact structure.

19. The integrated circuit structure of claim 14, wherein the second portions of the first and second conductive contact structures have a bottom surface co-planar with a bottom surface of the first and second fins.

20. The integrated circuit structure of claim 14, wherein the first vertical arrangement of nanowires is a first vertical arrangement of silicon nanowires, and the first fin is a first silicon fin, and wherein the second vertical arrangement of nanowires is a second vertical arrangement of silicon nanowires, and the second fin is a second silicon fin.

21. The integrated circuit structure of claim 14, wherein the first and second gate stacks each comprise a high-k gate dielectric layer and a metal gate electrode.

22. The integrated circuit structure of claim 14, wherein the first and second epitaxial source or drain structures are non-discrete first and second epitaxial source or drain structures, and wherein the third and fourth epitaxial source or drain structures are non-discrete third and fourth epitaxial source or drain structures.

23. The integrated circuit structure of claim 14, wherein the first and second epitaxial source or drain structures are discrete first and second epitaxial source or drain structures, and wherein the third and fourth epitaxial source or drain structures are discrete third and fourth epitaxial source or drain structures.

24. An integrated circuit structure, comprising:
a first fin and a second fin;
a first gate stack over the first fin, and a second gate stack over the second fin;
a first epitaxial source or drain structure at a first end of the first fin, and a second epitaxial source or drain structure at a second end of the first fin;
a third epitaxial source or drain structure at a first end of the second fin, and a fourth epitaxial source or drain structure at a second end of the second fin;

a first conductive contact structure coupled to one of the first or the second epitaxial source or drain structures, the first conductive contact structure having a first portion partitioned from a second portion; and a second conductive contact structure coupled to one of the third or the fourth epitaxial source or drain structures, the second conductive contact structure having a first portion partitioned from a second portion, and the second conductive contact structure neighboring the first conductive contact structure and having a composition different than a composition of the first conductive contact structure, wherein the first portion of the first conductive contact structure is on a first surface of the one of the first or the second epitaxial source or drain structures, and the second portion of the first conductive contact structure is on a second surface of the one of the first or the second epitaxial source or drain structures, the second surface opposite the first surface, and wherein the first portion of the second conductive contact structure is on a first surface of the one of the third or the fourth epitaxial source or drain structures, and the second portion of the second conductive contact structure is on a second surface of the one of the third or the fourth epitaxial source or drain structures, the second surface opposite the first surface.

25. An integrated circuit structure, comprising:
a first nanowire and a second nanowire;
a first gate stack around the first nanowire, and a second gate stack around the second nanowire;
a first epitaxial source or drain structure at a first end of the first nanowire, and a second epitaxial source or drain structure at a second end of the first nanowire;
a third epitaxial source or drain structure at a first end of the second nanowire, and a fourth epitaxial source or drain structure at a second end of the second nanowire;

a first conductive contact structure coupled to one of the first or the second epitaxial source or drain structures, the first conductive contact structure having a first portion partitioned from a second portion; and a second conductive contact structure coupled to one of the third or the fourth epitaxial source or drain structures, the second conductive contact structure having a first portion partitioned from a second portion, and the second conductive contact structure neighboring the first conductive contact structure and having a composition different than a composition of the first conductive contact structure, wherein the first portion of the first conductive contact structure is on a first surface of the one of the first or the second epitaxial source or drain structures, and the second portion of the first conductive contact structure is on a second surface of the one of the first or the second epitaxial source or drain structures, the second surface opposite the first surface, and wherein the first portion of the second conductive contact structure is on a first surface of the one of the third or the fourth epitaxial source or drain structures, and the second portion of the second conductive contact structure is on a second surface of the one of the third or the fourth epitaxial source or drain structures, the second surface opposite the first surface.

* * * * *